(12) United States Patent
Son et al.

(10) Patent No.: US 11,665,900 B2
(45) Date of Patent: May 30, 2023

(54) VERTICAL MEMORY DEVICES INCLUDING CHARGE TRAPPING PATTERNS WITH IMPROVED RETENTION CHARACTERISTICS

(71) Applicant: SAMSUNG ELCTRONICS CO., LTD., Suwon-si (KR)

(72) Inventors: Younghwan Son, Hwaseong-si (KR); Juyoung Lim, Seoul (KR); Sunil Shim, Seoul (KR); Suhyeong Lee, Suwon-si (KR); Sanghoon Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 24 days.

(21) Appl. No.: 16/853,416

(22) Filed: Apr. 20, 2020

(65) Prior Publication Data

US 2021/0066345 A1 Mar. 4, 2021

(30) Foreign Application Priority Data

Sep. 3, 2019 (KR) .......................... 10-2019-0108612

(51) Int. Cl.
*H01L 27/11582* (2017.01)
*H01L 27/1157* (2017.01)
*H01L 27/11565* (2017.01)

(52) U.S. Cl.
CPC .... *H01L 27/11582* (2013.01); *H01L 27/1157* (2013.01); *H01L 27/11565* (2013.01)

(58) Field of Classification Search
CPC ........ H01L 27/11502–11597; H01L 29/40117; H01L 29/792; H01L 29/66833
See application file for complete search history.

(56) References Cited

U.S. PATENT DOCUMENTS

| | | | |
|---|---|---|---|
| 7,927,953 B2 | 4/2011 | Ozawa | |
| 8,987,087 B2 | 3/2015 | Chien et al. | |
| 9,230,979 B1* | 1/2016 | Pachamuthu | ..... H01L 27/11582 |
| 9,362,303 B2 | 6/2016 | Lee et al. | |
| 9,576,975 B2 | 2/2017 | Zhang et al. | |
| 10,068,917 B2 | 9/2018 | Kanamori et al. | |
| 10,141,221 B1 | 11/2018 | Lai et al. | |
| 10,256,247 B1 | 4/2019 | Kanakamedala et al. | |

(Continued)

*Primary Examiner* — Allen L Parker
*Assistant Examiner* — Gustavo G Ramallo
(74) *Attorney, Agent, or Firm* — F. Chau & Associates, LLC

(57) ABSTRACT

A vertical memory device includes a channel extending vertically on a substrate. A charge storage structure is disposed on a sidewall of the channel. Gate electrodes are spaced apart from each other vertically and surround the charge storage structure. A first insulation pattern includes an air gap between the gate electrodes. The charge storage structure includes a tunnel insulation layer, a charge trapping pattern, and a first blocking pattern sequentially stacked horizontally. The charge storage structure includes charge trapping patterns spaced apart from each other vertically. Each of the charge trapping patterns faces one of the gate electrodes horizontally. A length in the first direction of an outer sidewall of each of the charge trapping patterns facing the first blocking pattern is less than that of an inner sidewall thereof facing the tunnel insulation layer.

21 Claims, 34 Drawing Sheets

(56) References Cited

U.S. PATENT DOCUMENTS

| | | |
|---|---|---|
| 10,312,255 B2 | 6/2019 | Yoshimizu et al. |
| 2005/0239244 A1* | 10/2005 | Tran ................. H01L 27/10855 |
| | | 438/244 |
| 2005/0239246 A1* | 10/2005 | Manning ............... H01L 27/105 |
| | | 438/257 |
| 2011/0233648 A1* | 9/2011 | Seol ................. H01L 29/42348 |
| | | 257/324 |
| 2013/0341701 A1 | 12/2013 | Blomme et al. |
| 2015/0014763 A1 | 1/2015 | Lee |
| 2015/0069494 A1 | 3/2015 | Makala et al. |
| 2015/0380431 A1* | 12/2015 | Kanamori ........... H01L 21/0217 |
| 2018/0053781 A1* | 2/2018 | Yoshimizu .......... H01L 21/0217 |
| 2018/0151588 A1 | 5/2018 | Tsutsumi et al. |
| 2019/0043882 A1 | 2/2019 | Hasnat et al. |
| 2019/0103411 A1* | 4/2019 | Liu .................. H01L 27/11582 |

* cited by examiner

VERTICAL MEMORY DEVICES INCLUDING CHARGE TRAPPING PATTERNS WITH IMPROVED RETENTION CHARACTERISTICS

CROSS-REFERENCE TO RELATED APPLICATIONS

This application claims priority under 35 USC § 119 to Korean Patent Application No. 10-2019-0108612, filed on Sep. 3, 2019 in the Korean Intellectual Property Office (KIPO), the contents of which are herein incorporated by reference in their entirety.

TECHNICAL FIELD

The present disclosure relates to a memory device and, more specifically, to a vertical memory device and a method of manufacturing the same.

DISCUSSION OF THE RELATED ART

In a VNAND flash memory device, a charge trapping layer on an outer sidewall of a vertical channel may extend in a vertical direction, and thus charge trapped in the charge trapping layer may travel in the vertical direction along a plurality of gate electrodes disposed in a plurality of different levels. As a result, the retention characteristic of the VNAND flash memory device may be deteriorated, which may cause reliability problems in storing and retrieving data from the VNAND flash memory device.

SUMMARY

A vertical memory device includes a channel disposed on a substrate. A charge storage structure is disposed on an outer sidewall of the channel. The vertical memory device further includes gate electrodes and a first insulation pattern disposed between the gate electrodes. The channel extends in a first direction that is perpendicular to an upper surface of the substrate. The charge storage structure includes a tunnel insulation layer, a charge trapping pattern, and a first blocking pattern sequentially stacked in a horizontal direction parallel to the upper surface of the substrate. The gate electrodes are spaced apart from each other in the first direction, and each of the gate electrodes surround the charge storage structure. The first insulation pattern includes an air gap therein. The charge storage structure includes charge trapping patterns spaced apart from each other in the first direction. Each of the charge trapping patterns face one of the gate electrodes in the horizontal direction. A length in the first direction of an outer sidewall of each of the charge trapping patterns facing the first blocking pattern is less than a length in the first direction of an inner sidewall of each of the charge trapping patterns facing the tunnel insulation layer.

A vertical memory device includes a channel disposed on a substrate. A charge storage structure is disposed on an outer sidewall of the channel. The vertical memory device includes gate electrodes, an insulation pattern disposed between the gate electrodes, and an etch stop layer disposed on lower and upper surfaces of the insulation pattern. The channel extends in a first direction perpendicular to an upper surface of the substrate. The charge storage structure includes a tunnel insulation layer, a charge trapping pattern, and a first blocking pattern sequentially stacked in a horizontal direction parallel to the upper surface of the substrate. The gate electrodes are spaced apart from each other in the first direction, and each of the gate electrodes surrounds the charge storage structure. The insulation pattern includes an air gap therein. The charge storage structure includes charge trapping patterns spaced apart from each other in the first direction. Each of the charge trapping patterns faces one of the gate electrodes in the horizontal direction.

A vertical memory device includes a channel disposed on a substrate. A charge storage structure is disposed on an outer sidewall of the channel. The vertical memory device further includes gate electrodes, an insulation pattern disposed between the gate electrodes, a protection layer, and a second blocking pattern. The channel extends in a first direction that is perpendicular to an upper surface of the substrate. The charge storage structure includes a tunnel insulation layer, a charge trapping pattern, and a first blocking pattern sequentially stacked in a horizontal direction parallel to the upper surface of the substrate. The gate electrodes are spaced apart from each other in the first direction. Each of the gate electrodes extends in a second direction parallel to the upper surface of the substrate so as to surround the charge storage structure. The insulation pattern includes an air gap therein. The protection layer covers a sidewall of an end portion in a third direction of each of the gate electrodes. The third direction is parallel to the upper surface of the substrate and crosses the second direction. The second blocking pattern covers lower and upper surfaces and a sidewall facing the charge storage structure of each of the gate electrodes and lower and upper surfaces of the protection layer. The charge storage structure includes charge trapping patterns spaced apart from each other in the first direction. Each of the charge trapping patterns faces one of the gate electrodes in the horizontal direction.

A vertical memory device includes a channel on a substrate, a charge storage structure on an outer sidewall of the channel, gate electrodes, an insulation pattern between the gate electrodes, and a second blocking pattern. The channel extends in a first direction that is perpendicular to an upper surface of the substrate. The charge storage structure includes a tunnel insulation layer, a charge trapping pattern, and a first blocking pattern that are sequentially stacked in a horizontal direction parallel to the upper surface of the substrate. The gate electrodes are spaced apart from each other in the first direction. Each of the gate electrodes extends in a second direction parallel to the upper surface of the substrate to surround the charge storage structure. The insulation pattern includes an air gap therein. The second blocking pattern covers lower and upper surfaces and a sidewall facing the charge storage structure of each of the gate electrodes and a sidewall of an end portion in a third direction of each of the gate electrodes. The third direction is parallel to the upper surface of the substrate and crosses the second direction. The charge storage structure includes charge trapping patterns that are spaced apart from each other in the first direction. Each of the charge trapping patterns faces one of the gate electrodes in the horizontal direction.

A vertical memory device includes a first pillar structure disposed on a substrate. A second pillar structure is disposed on the substrate. The vertical memory device further includes gate electrodes, an insulation pattern disposed between the gate electrodes, and a second blocking pattern. The first pillar structure extends in a first direction that is perpendicular to an upper surface of the substrate, and include a channel having a cup-like shape, a charge storage structure on an outer sidewall of the channel, and a filling pattern. The charge storage structure includes a tunnel insulation layer, a charge trapping pattern, and a first blocking pattern sequentially stacked in a horizontal direction parallel to the upper surface of the substrate. The filling pattern fills an inner space formed by the channel. The second pillar structure extends in the first direction, and includes an insulating material. The gate electrodes are spaced apart from each other in the first direction. Each of the gate electrodes extends in a second direction that is parallel to the upper surface of the substrate so as to surround the first and second pillar structures. The second blocking pattern covers lower and upper surfaces and a sidewall facing the charge storage structure of each of the gate electrodes and a sidewall of an end portion in a third direction of each of the gate electrodes. The third direction is parallel to the upper surface of the substrate and crosses the second direction. The second blocking layer covers a sidewall of the insulation pattern facing the second pillar structure, and extends in the first direction between the second pillar structure and the first pillar structure.

A vertical memory device includes a channel disposed on a substrate. A charge storage structure is disposed on an outer sidewall of the channel. The vertical memory device further includes gate electrodes, a first insulation pattern disposed between the gate electrodes, a common source pattern (CSP), and a bit line. The channel extends in a first direction that is perpendicular to an upper surface of the substrate. The charge storage structure includes a tunnel insulation layer, a charge trapping pattern, and a first blocking pattern sequentially stacked in a horizontal direction parallel to the upper surface of the substrate. The gate electrodes are spaced apart from each other in the first direction. Each of the gate electrodes extends in a second direction that is parallel to the upper surface of the substrate to surround the charge storage structure. The CSP extends in the second direction on the substrate, and is adjacent end portions of the gate electrodes in a third direction parallel to the upper surface of the substrate and crossing the second direction. The bit line extends in the third direction on the gate electrodes so as to be electrically connected to the channel. The charge storage structure includes charge trapping patterns spaced apart from each other in the first direction. Each of the charge trapping patterns faces one of the gate electrodes in the horizontal direction. A length in the first direction of each of the charge trapping patterns at an outer sidewall thereof facing the first blocking pattern is less than a length in the first direction of each of the charge trapping patterns at an inner sidewall thereof facing the tunnel insulation layer.

A method of manufacturing a vertical memory device includes forming a mold on a substrate to include a first sacrificial layer and a second sacrificial layer structure alternately and repeatedly stacked. A channel and a charge storage structure are formed on the substrate. The channel extends through the mold. The charge storage structure is disposed on an outer sidewall of the channel to include a tunnel insulation layer, a charge trapping layer and a first blocking layer sequentially stacked in a horizontal direction parallel to an upper surface of the substrate. A first opening is formed through the mold so as to expose an upper surface of the substrate so that the first sacrificial layer and the second sacrificial layer structure are transformed into a first sacrificial pattern and a second sacrificial structure. The first sacrificial pattern is replaced with a third sacrificial pattern through the first opening. The third sacrificial pattern includes a material that is different from that of the first sacrificial pattern. The second sacrificial structure and a portion of the first blocking layer are removed to form a second opening so that the first blocking layer is divided into first blocking patterns spaced apart from each other in a vertical direction that is perpendicular to the upper surface of the substrate. A portion of the charge trapping layer is removed so as to form a third opening connected to the second opening so that the charge trapping layer is divided into charge trapping patterns spaced apart from each other in the vertical direction. An insulation pattern is formed so as to fill the second and third openings. The insulation pattern includes an air gap therein. The third sacrificial pattern is replaced with a gate electrode.

A method of manufacturing a vertical memory device includes forming a mold on a substrate so as to include a first sacrificial layer and a second sacrificial layer structure alternately and repeatedly stacked in a first direction perpendicular to an upper surface of the substrate. A channel and a charge storage structure is formed on the substrate. The channel extends through the mold. The charge storage structure is on an outer sidewall of the channel so as to include a tunnel insulation layer, a charge trapping layer and a first blocking layer sequentially stacked in a horizontal direction parallel to the upper surface of the substrate. A first opening is formed through the mold so as to expose an upper surface of the substrate so that the first sacrificial layer and the second sacrificial layer structure are transformed into a first sacrificial pattern and a second sacrificial structure. The first opening extends in a second direction that is parallel to the upper surface of the substrate. The first sacrificial pattern is replaced with a gate electrode. A protection layer is formed so as to cover a sidewall of an end portion of the gate electrode in a third direction that is parallel to the upper surface of the substrate and crosses the second direction. The second sacrificial structure and a portion of the first blocking layer are removed so as to form a second opening so that the first blocking layer is divided into first blocking patterns spaced apart from each other in the first direction. A portion of the charge trapping layer is removed to form a third opening connected to the second opening so that the charge trapping layer is divided into charge trapping patterns spaced apart from each other in the first direction. An insulation pattern is formed so as to fill the second and third openings to include an air gap therein.

A method of manufacturing a vertical memory device includes forming a mold on a substrate so as to include a first sacrificial layer and a second sacrificial layer structure alternately and repeatedly stacked. A channel and a charge storage structure are formed on the substrate. The channel extends through the mold. The charge storage structure is disposed on an outer sidewall of the channel and includes a tunnel insulation layer, a charge trapping layer and a first blocking layer sequentially stacked in a horizontal direction parallel to an upper surface of the substrate. A first opening is formed through the mold so as to expose an upper surface of the substrate so that the first sacrificial layer and the second sacrificial layer structure are transformed into a first sacrificial pattern and a second sacrificial structure, respectively. The first sacrificial pattern is replaced with a third sacrificial pattern through the first opening. The third sacrificial pattern includes a material that is different from that of the first sacrificial pattern. The second sacrificial structure and a portion of the first blocking layer are removed to form a second opening so that the first blocking layer is divided into first blocking patterns spaced apart from each other in a vertical direction perpendicular to the upper surface of the substrate. A portion of the charge trapping layer exposed by the second opening is oxidized so as to form a division layer so that the charge trapping layer is divided into charge trapping patterns spaced apart from each other in the vertical direction. An insulation pattern is formed to fill the second and third openings to include an air gap therein. The third sacrificial pattern is replaced with a gate electrode.

A method of manufacturing a vertical memory device includes forming a mold on a substrate so as to include a first sacrificial layer and a second sacrificial layer structure alternately and repeatedly stacked. A channel, a first charge storage structure and second charge storage structures are formed on the substrate. The channel extends through the mold. Each of the first and second charge storage structures is disposed on an outer sidewall of the channel and includes a tunnel insulation layer, a charge trapping layer, and a first blocking layer sequentially stacked in a horizontal direction parallel to an upper surface of the substrate. A first opening is formed through the mold so as to expose an upper surface of the substrate so that the first sacrificial layer and the second sacrificial layer structure is transformed into a first sacrificial pattern and a second sacrificial structure, respectively. The first sacrificial pattern is replaced with a third sacrificial pattern through the first opening. The third sacrificial pattern includes a material that is different from that of the first sacrificial pattern. Each of the second charge storage structures is removed so as to form a second opening. The second sacrificial structure and a portion of the first blocking layer are removed so as to form a third opening so that the first blocking layer is divided into first blocking patterns spaced apart from each other in a first direction perpendicular to the upper surface of the substrate. A portion of the charge trapping layer is removed so as to form a fourth opening connected to the third opening so that the charge trapping layer is divided into charge trapping patterns spaced apart from each other in the first direction. A first insulation pattern is formed to fill the third and fourth openings to include an air gap therein. The third sacrificial pattern is replaced with a gate electrode.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

The above and other aspects and features of the vertical memory devices and the methods of manufacturing the same in accordance with exemplary embodiments of the present disclosure will become readily understood from detail descriptions that follow, with reference to the accompanying drawings. Hereinafter in the specifications, a direction substantially perpendicular to an upper surface of a substrate may be defined as a first direction, and two directions substantially parallel to the upper surface of the substrate and crossing each other may be defined as second and third directions, respectively. In exemplary embodiments of the present disclosure, the second and third directions may be substantially perpendicular to each other.

It will be understood that, although the terms "first," "second," and/or "third" may be used herein to describe various elements, components, regions, layers and/or sections, these elements, components, regions, layers and/or sections should not necessarily be limited by these terms. These terms are used to distinguish one element, component, region, layer or section from another region, layer or section. Thus, a first element, component, region, layer or section discussed below could be termed a second or third element, component, region, layer or section without departing from the teachings of inventive concepts.

FIGS. 1 to 21 are cross-sectional views illustrating a method of manufacturing a vertical memory device in accordance with exemplary embodiments of the present disclosure.

Particularly, FIGS. 1, 4, 6 and 8 are plan views, and FIGS. 2-3, 5, 7 and 9-21 are cross-sectional views. FIGS. 2-3 and 5 are cross-sectional views taken along lines A-A' of corresponding plan views, respectively. FIG. 7 is a cross-sectional view taken along a line B-B' of a corresponding plan view. FIGS. 9 and 10-21 are cross-sectional views taken along lines C-C' of corresponding plan views, respectively. FIGS. 10 to 19 are enlarged cross-sectional views of a region X of FIG. 9.

Figure 1:
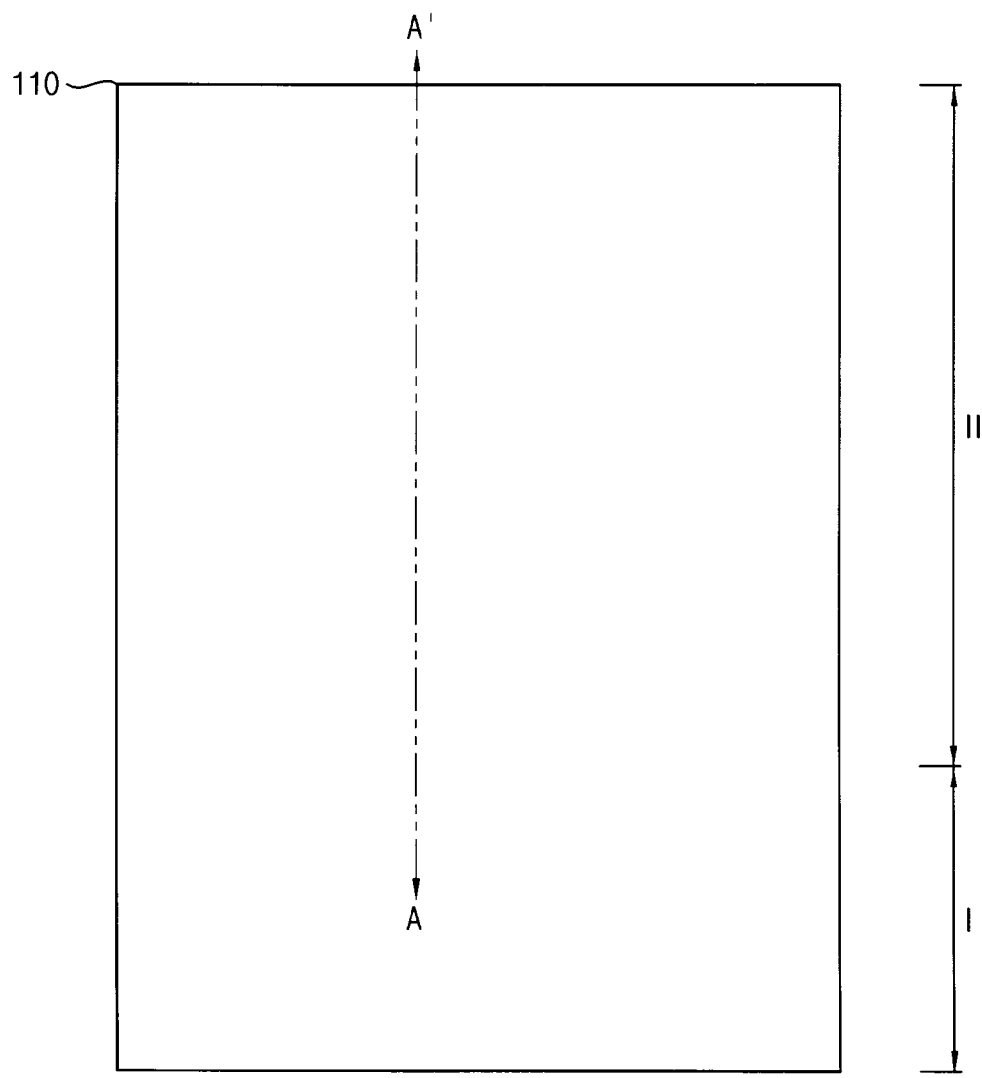
FIGS. 1 to 21 are cross-sectional views illustrating a method of manufacturing a vertical memory device in accordance with exemplary embodiments of the present disclosure.
Figure 1:
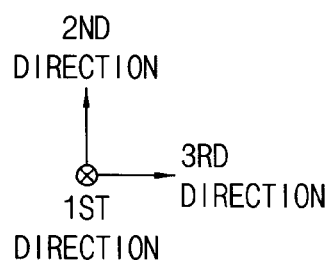
Figure 2:
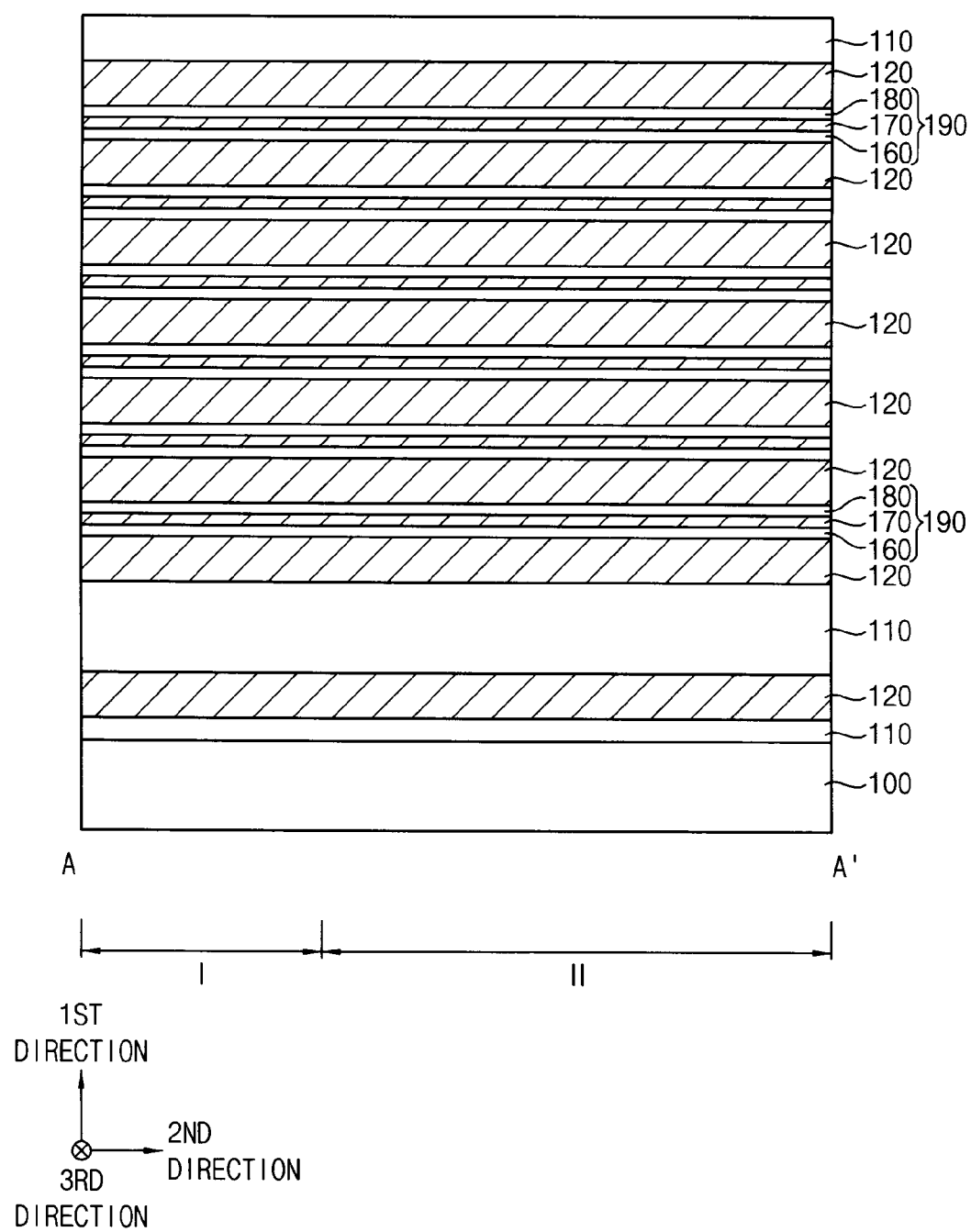
Figure 3:
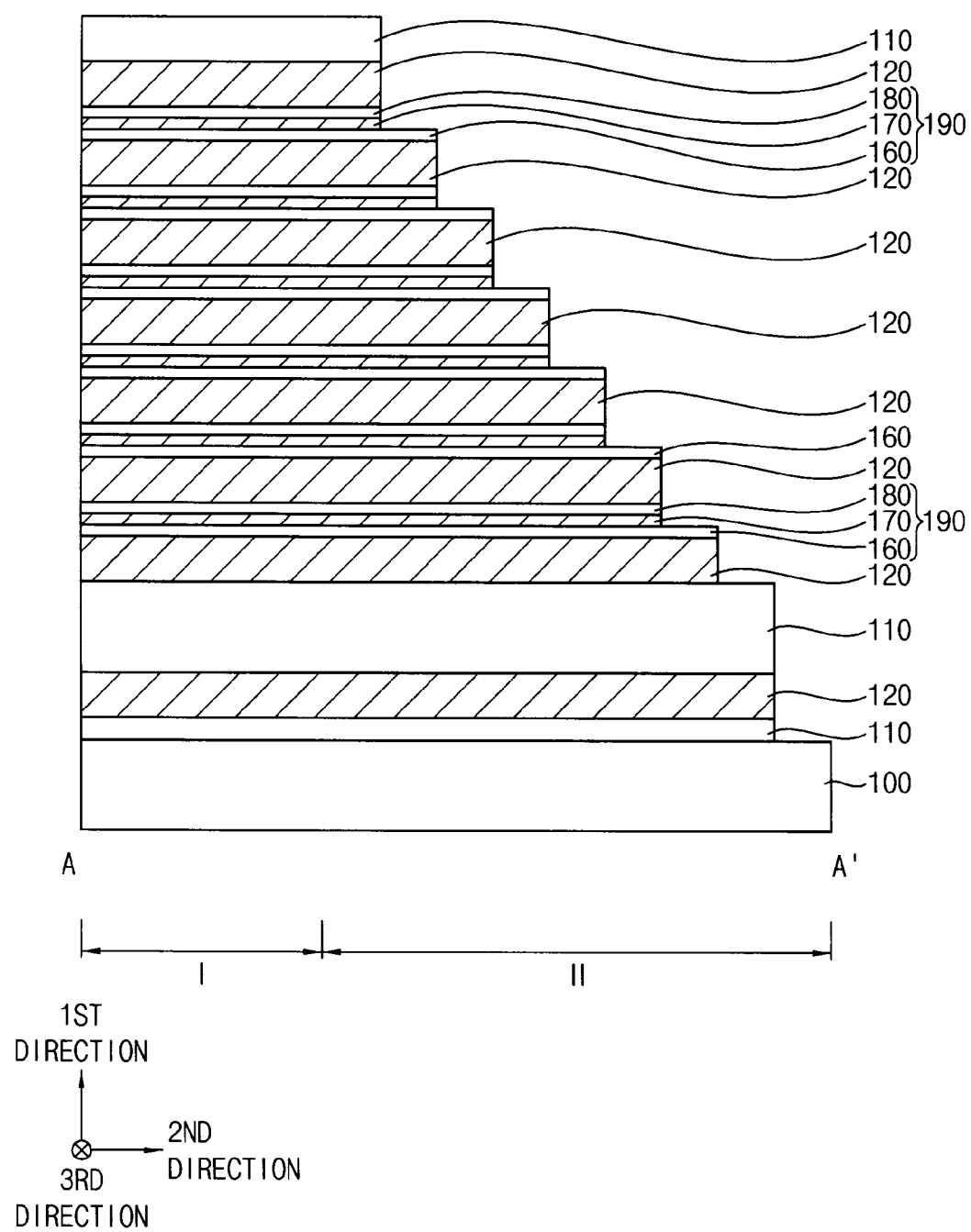

Referring to FIGS. 1 and 2, a mold layer including a first insulation layer 110, a first sacrificial layer 120 and a second sacrificial layer structure 190 may be formed on a substrate 100.

The substrate 100 may include silicon, germanium, silicon-germanium or a III-V compound such as GaP, GaAs, GaSb, etc. In some exemplary embodiments of the present disclosure, the substrate 100 may be a silicon-on-insulator (SOI) substrate or a germanium-on-insulator (GOI) substrate. For example, n-type impurities may be doped into the substrate 100.

The substrate 100 may include a first region I and a second region II at least partially surrounding the first region I. The first region I may be a cell array region in which memory cells may be formed, and the second region II may be an extension region or a staircase region in which contact plugs transferring electrical signals to the memory cells may be formed.

In exemplary embodiments of the present disclosure, the mold layer may include the first insulation layer 110, the first sacrificial layer 120, and the first insulation layer 110 sequentially stacked on the substrate 100, and may further include the first sacrificial layer 120 and the second sacrificial layer structure 190 alternately and repeatedly stacked on the first insulation layer 110, and the first insulation layer 110 on an uppermost one of the first sacrificial layers 120.

The first insulation layer 110 may include an oxide, e.g., silicon oxide, and the first sacrificial layer 120 may include a material having an etching selectivity with respect to the first insulation layer 110, e.g., a nitride such as silicon nitride.

In exemplary embodiments of the present disclosure, the second sacrificial layer structure 190 may include second, third and fourth sacrificial layers 160, 170 and 180 sequentially stacked in the first direction. Each of the second and fourth sacrificial layers 160 and 180 may include an oxide, e.g., silicon oxide, and the third sacrificial layer 170 may include a nitride, e.g., silicon nitride.

In exemplary embodiments of the present disclosure, a thickness in the first direction of the second sacrificial layer structure 190 may be equal to or less than a thickness in the first direction of the first sacrificial layer 120, and thus the third sacrificial layer 170 included in the second sacrificial layer structure 190 may have a thickness in the first direction that is less than that of the first sacrificial layer 120.

Referring to FIG. 3, an etching process using a photoresist pattern as an etching mask may be performed to pattern the mold layer, and a trimming process for reducing an area of the photoresist pattern may also be performed. The etching process and the trimming process may be alternately and repeatedly performed to form a mold of a staircase shape having a plurality of step layers disposed on the substrate 100.

Hereinafter, the "step layer" may be used to refer to a layer at the same level including, not only a portion exposed to the outside but also a portion not exposed, and only the exposed portion of the step layer that is not covered by upper step layers may be referred to as a "step." In exemplary embodiments of the present disclosure, the steps may be arranged in the second direction, which are shown in the drawing. However, the inventive concept might not be limited thereto, and the steps may be further arranged in the third direction.

In exemplary embodiments of the present disclosure, each of the step layers may include the first sacrificial layer 120, the second sacrificial layer 160 thereon, and the third and fourth sacrificial layers 170 and 180 sequentially stacked thereunder. An upper surface of an end portion of the second sacrificial layer 160, for example, in the second direction may form an upper surface of each of the steps.

Figure 4:
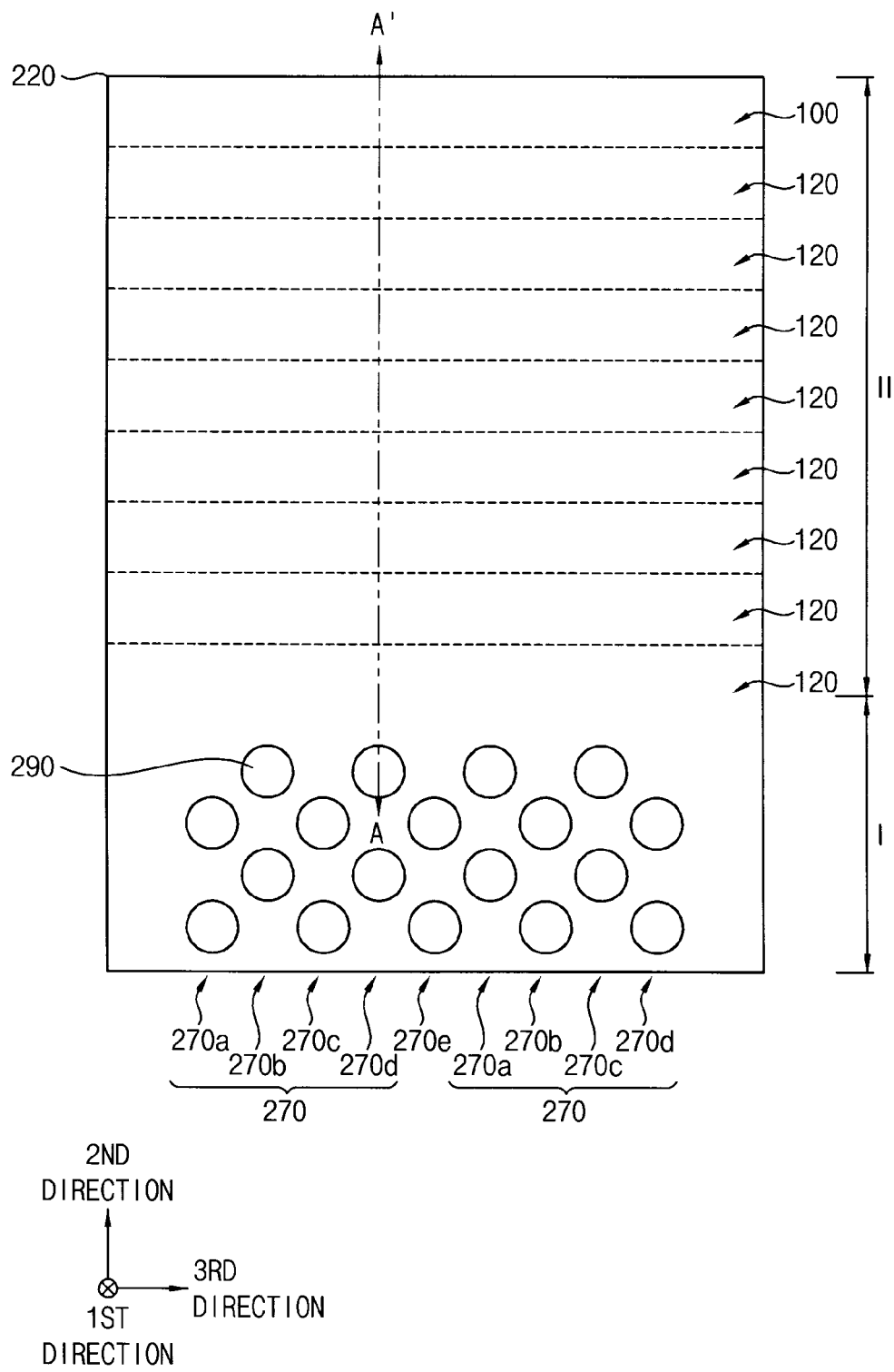
Figure 5:
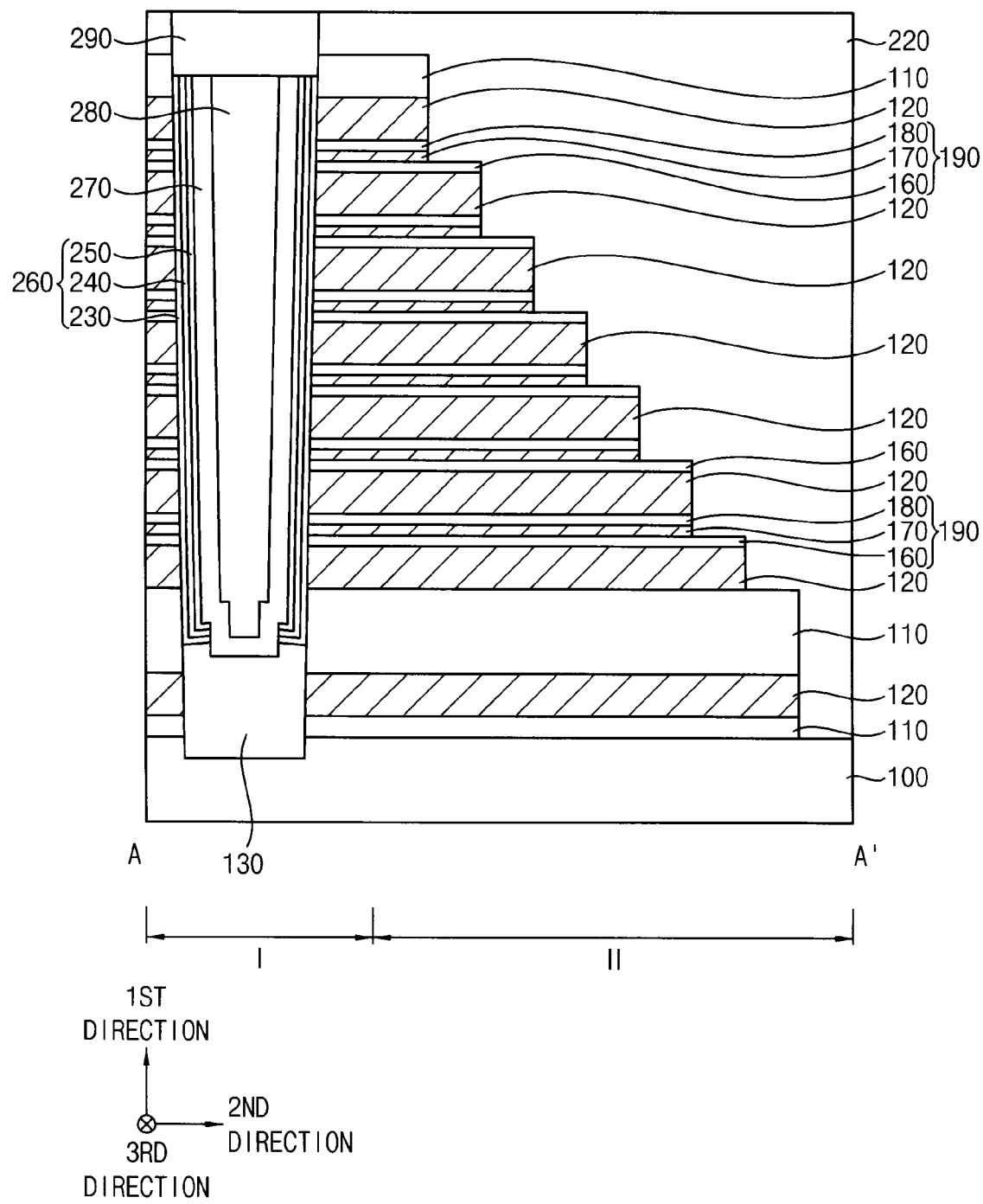

Referring to FIGS. 4 and 5, a first insulating interlayer 220 may be formed on the substrate 100 so as to cover the mold, and a first pillar structure may be formed through the first insulating interlayer 220 and the mold to contact an upper surface of the substrate 100.

The first pillar structure may be formed by performing, e.g., a dry etching process to form a channel hole through the first insulating interlayer 220 and the mold to expose the upper surface of the substrate 100 and to fill the channel hole. In exemplary embodiments of the present disclosure, the dry etching process may be performed until the channel hole may expose the upper surface of the substrate 100, and further the channel hole may extend through an upper portion of the substrate 100. In exemplary embodiments of the present disclosure, a plurality of channel holes may be formed in each of the second and third directions, and thus a channel hole array may be defined.

A selective epitaxial growth (SEG) process may be performed using the exposed upper surface of the substrate 100 as a seed to form a semiconductor pattern 130 filling a lower portion of the channel hole. The semiconductor pattern 130 may include, e.g., crystalline silicon. In exemplary embodiments of the present disclosure, an upper surface of the semiconductor pattern 130 may be higher than a lower surface of one of the first insulation layer 110 at a second level from the upper surface of the substrate 100 in the first direction and lower than an upper surface thereof.

A first blocking layer 230, a charge trapping layer 240, a tunnel insulation layer 250 and a first spacer layer may be sequentially formed on a sidewall of the channel hole, the upper surface of the semiconductor pattern 130 and an upper surface of the first insulating interlayer 220. The first spacer layer may be anisotropically etched to form a first spacer on the sidewall of the channel hole. The tunnel insulation layer 250, the charge trapping layer 240 and the first blocking layer 230 may be etched using the first spacer as an etching mask so that each of the tunnel insulation layer 250, the charge trapping layer 240 and the first blocking layer 230 may have a cup-like shape of which a bottom is opened on the upper surface of the semiconductor pattern 130 and the sidewall of the channel hole. An upper portion of the semiconductor pattern 130 may also be partially removed. The first blocking layer 230, the charge trapping layer 240 and the tunnel insulation layer 250 sequentially stacked on the upper surface of the semiconductor pattern 130 and the sidewall of the channel hole may form a charge storage layer structure 260.

After removing the first spacer, a channel layer may be formed on the charge storage layer structure 260 and the first insulating interlayer 220, and a filling layer may be formed on the channel layer to fill a remaining portion of the channel hole. The filling layer and the channel layer may be planarized until an upper surface of the first insulating interlayer 220 may be exposed so that a filling pattern 280 having a pillar shape may be formed to fill a remaining portion of the channel hole and that the channel layer may be transformed into a channel 270 having a cup-like shape covering a sidewall and a bottom surface of the filling pattern 280. Thus, the charge storage layer structure 260, the channel 270 and the filling pattern 280 may be sequentially stacked on the semiconductor pattern 130.

As the channel holes in which the channel 270s are formed, respectively, may define the channel hole array, the channels 270 in the respective channel holes may also define a channel array. In exemplary embodiments of the present disclosure, the channel array may include a first channel column 270a including first channels disposed in the second direction, and a second channel column 270b including second channels disposed in the second direction and being spaced apart from the first channel column 270a in the third direction. The first channels included in the first channel column 270a may form acute angles with the second direction or the third direction from the second channels included in the second channel column 270b. Thus, the first and second channels may be arranged in a zigzag pattern.

The first and second channel columns 270a and 270b may be alternately and repeatedly disposed in the third direction. In exemplary embodiments of the present disclosure, five first channel columns 270a and four second channel columns 270b may be alternately disposed in the third direction to form a channel block. The channel array may include a plurality of channel blocks spaced apart from each other in the third direction.

The number of the channel columns included in one channel block might not be limited thereto. Hereinafter, four channel columns disposed in the third direction in one channel block may be referred to as first, second, third and fourth channel columns 270a, 270b, 270c and 270d, respectively, in this order, one channel column at a central position in the third direction in the channel block may be referred to as a fifth channel column 270e, and the other four channel columns disposed in the third direction in the channel block may be referred to as the first, second, third and fourth channel columns 270a, 270b, 270c and 270d, respectively, again in this order.

Upper portions of the filling pattern 280, the channel 270 and the charge storage layer structure 260 may be removed to form a first recess. A capping layer may be formed on the first insulating interlayer 220 to fill the first recess. The capping layer may be planarized until the upper surface of the first insulating interlayer 220 may be exposed to form a capping pattern 290. The capping pattern 290 may include, e.g., doped or undoped polysilicon.

The semiconductor pattern 130, the charge storage layer structure 260, the channel 270, the filling pattern 280 and the capping pattern 290 in the channel hole may together form the first pillar structure.

Figure 6:
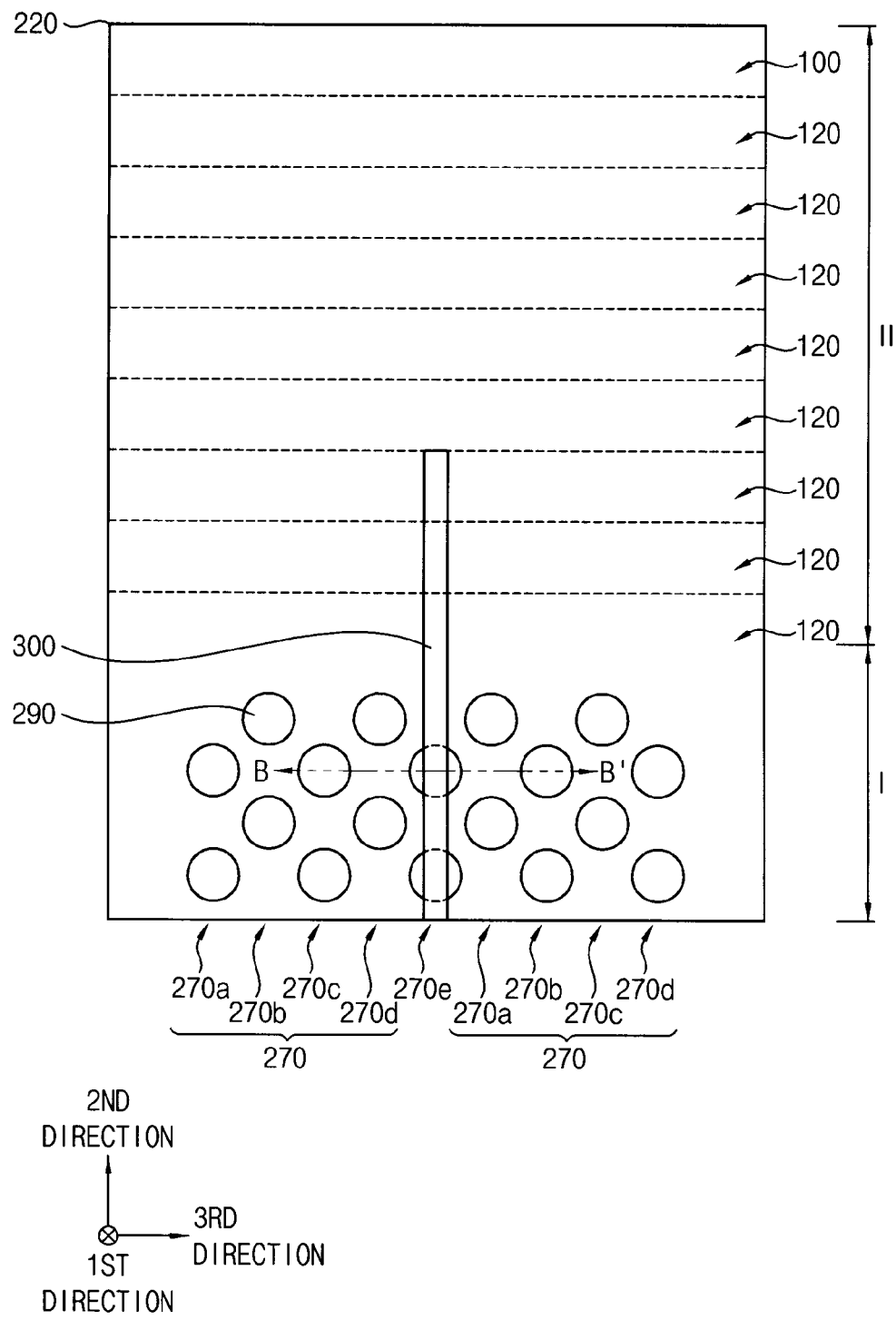
Figure 7:
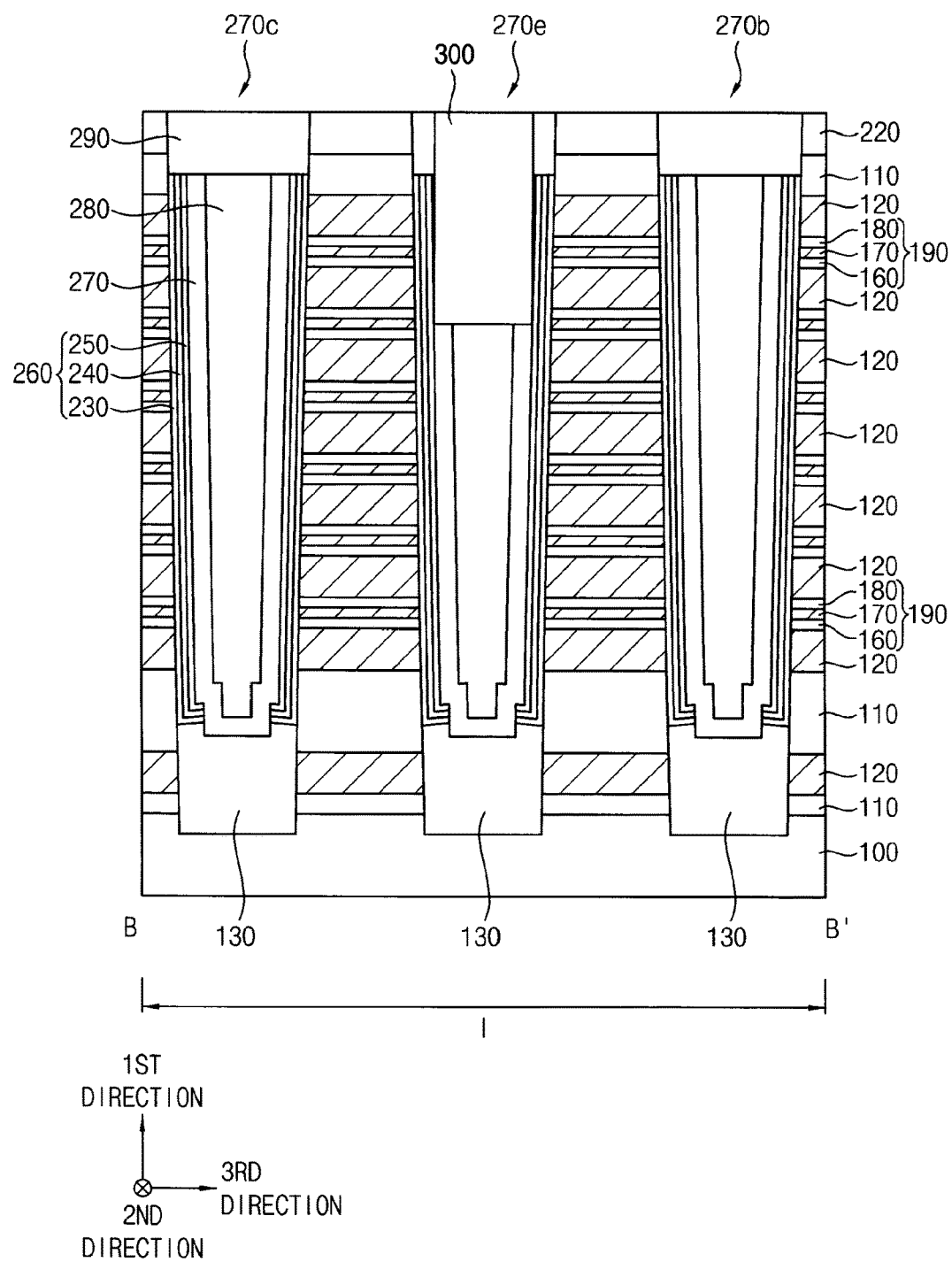

Referring to FIGS. 6 and 7, a first division layer 300 may be formed through portions of the first insulation layer 110, the first sacrificial layer 120 and the second sacrificial layer structure 190.

The first division layer 300 may be formed by forming an etching mask on the first insulating interlayer 220, partially etching the first insulating interlayer 220, the first insulation layer 110, the first sacrificial layer 120, the second sacrificial layer structure 190 and the first pillar structure to form a second recess, and filling into the second recess. The first division layer 300 may include an oxide, e.g., silicon oxide.

In exemplary embodiments of the present disclosure, the division layer 300 may extend in the second direction at a central portion of each channel block in the third direction, and may extend through an upper portion of the channels 270 included in the fifth channel columns 270e. Thus, the channels 270 included in the fifth channel columns 270e may serve as dummy channels.

In exemplary embodiments of the present disclosure, the first division layer 300 may extend through not only the upper portions of the channels 270 but also the first insulating interlayer 220, an uppermost one of the first insulation layers 110, ones of the first sacrificial layers 120 at upper two levels, respectively, and an uppermost one of the second sacrificial layer structures 190, and may extend partially through one of the second sacrificial layer structures 190 at a second level from above. The first division layer 300 may extend in the second direction through upper two step layers of the mold, and thus the first sacrificial layers 120 at upper two levels, respectively, may be divided in the third direction by the first division layer 300.

Figure 8:
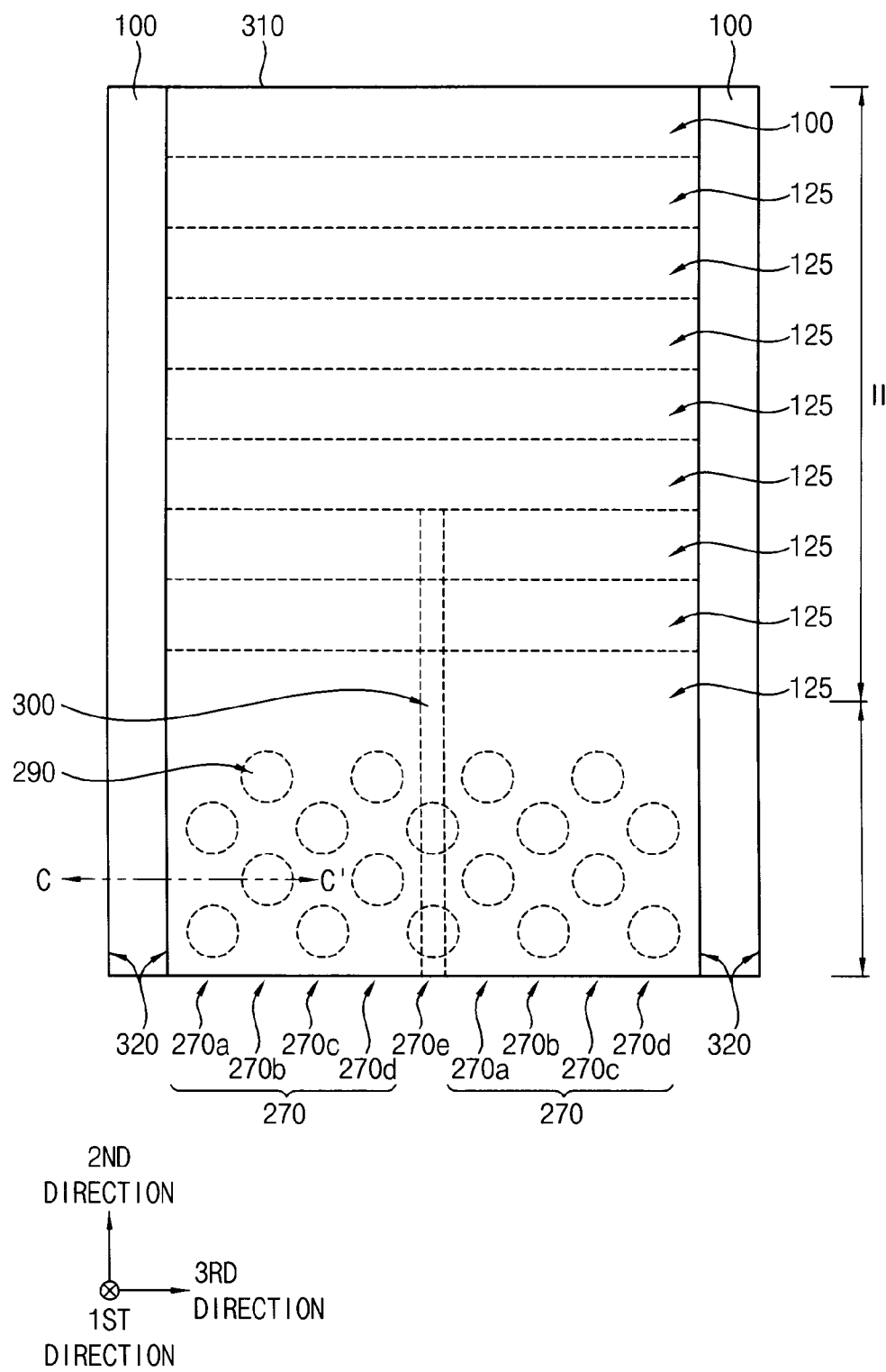
Figure 9:
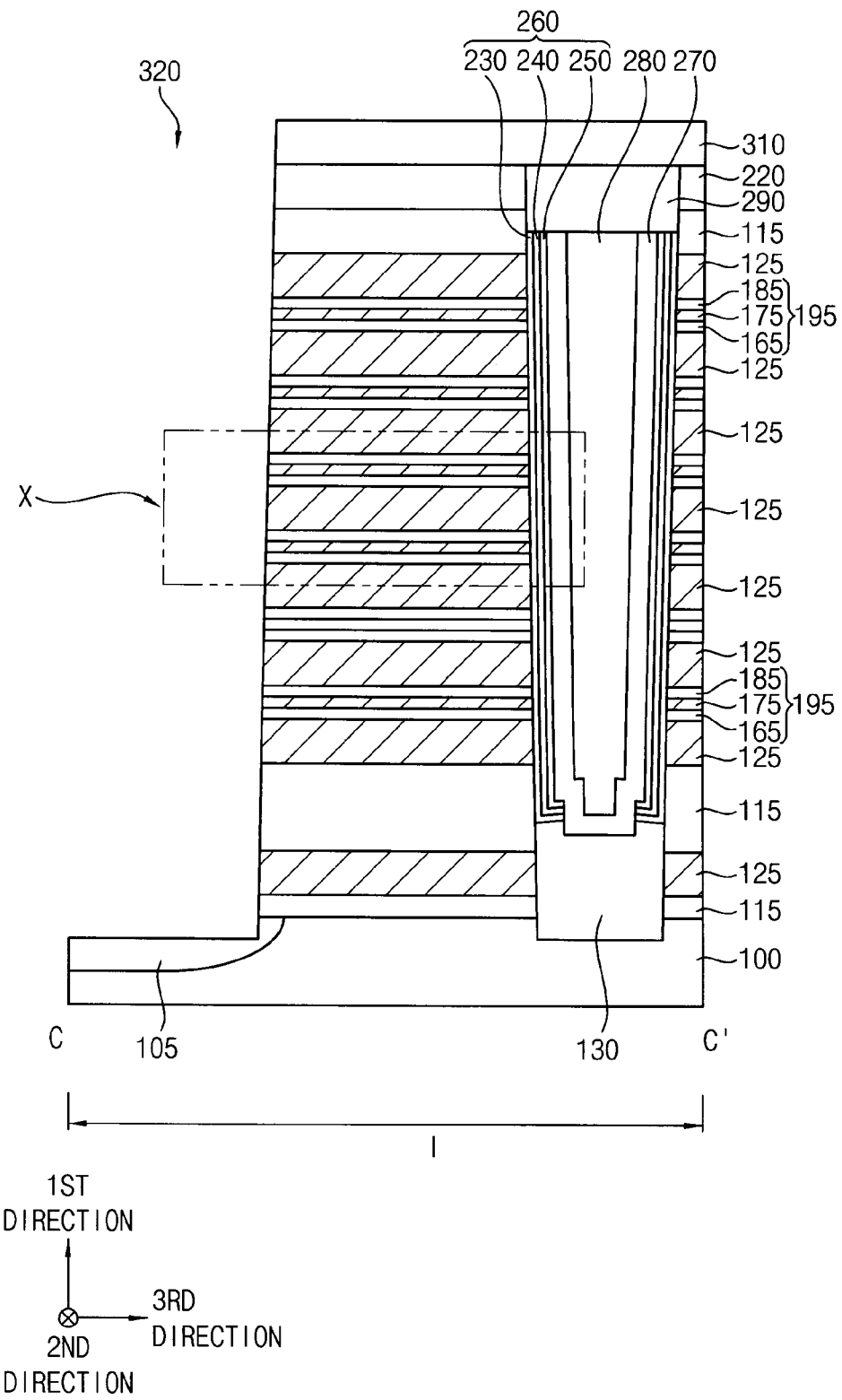

Referring to FIGS. 8 and 9, a second insulating interlayer 310 may be formed on the first insulating interlayer 220 and the capping pattern 290, and a dry etching process may be performed to form a first opening 320 through the first and second insulating interlayers 220 and 310 and the mold.

In exemplary embodiments of the present disclosure, the dry etching process may be performed until the upper surface of the substrate 100 may be exposed by the first opening 320, and further the first opening 320 may extend through an upper portion of the substrate 100. As the first opening 320 is formed, the first insulation layer 110, the first sacrificial layer 120 and the second sacrificial layer structure 190 included in the mold may be exposed.

In exemplary embodiments of the present disclosure, the first opening 320 may extend in the second direction between neighboring ones of the channel blocks, and a plurality of first openings 320 may be formed in the third direction. As the first opening 320 is formed, the first insulation layer 110, the first sacrificial layer 120 and the second sacrificial layer structure 190 may be transformed into a first insulation pattern 115, a first sacrificial pattern 125 and a second sacrificial structure 195, respectively. The second sacrificial structure 195 may include second, third and fourth sacrificial patterns 165, 175 and 185 sequentially stacked in the first direction.

Impurities may be implanted into an upper portion of the substrate 100 exposed by the first opening 320 to form an impurity region 105.

Figure 10:
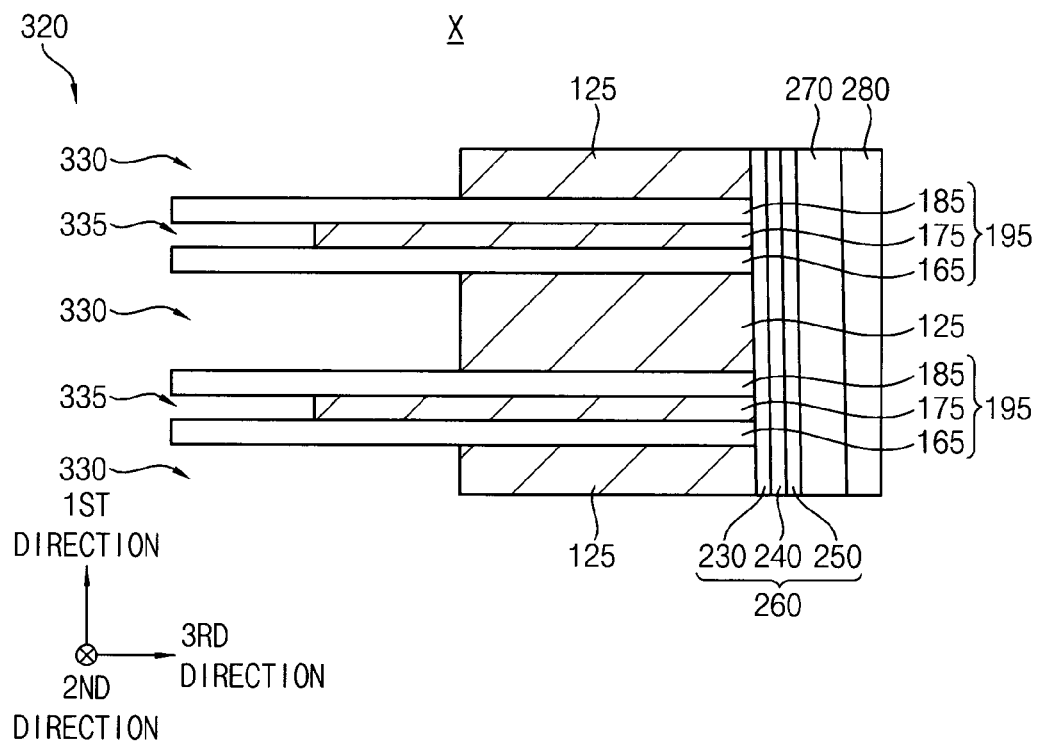

Referring to FIG. 10, the first and third sacrificial patterns 125 and 175 exposed by the first opening 320 may be partially removed to form third and fourth recesses 330 and 335, respectively, and thus a length in the second direction of each of the first and third sacrificial patterns 125 and 175 may be reduced.

In exemplary embodiments of the present disclosure, the first and third sacrificial patterns 125 and 175 may be partially removed by a wet etching process using phosphoric acid ($H_3PO_4$) as an etchant. The third sacrificial pattern 175 may have a thickness that is less than that of the first sacrificial pattern 125, and thus an amount of the third sacrificial pattern 175 removed in the wet etching process may be less than that of the first sacrificial pattern 125 removed therein. Accordingly, a depth in the third direction of the fourth recess 335 may be less than a depth in the third direction of the third recess 330.

As the third and fourth recesses 330 and 335 are formed, surfaces of end portions in the third direction of the second and fourth sacrificial patterns 165 and 185 included in the second sacrificial structure 195 may be exposed.

Figure 11:
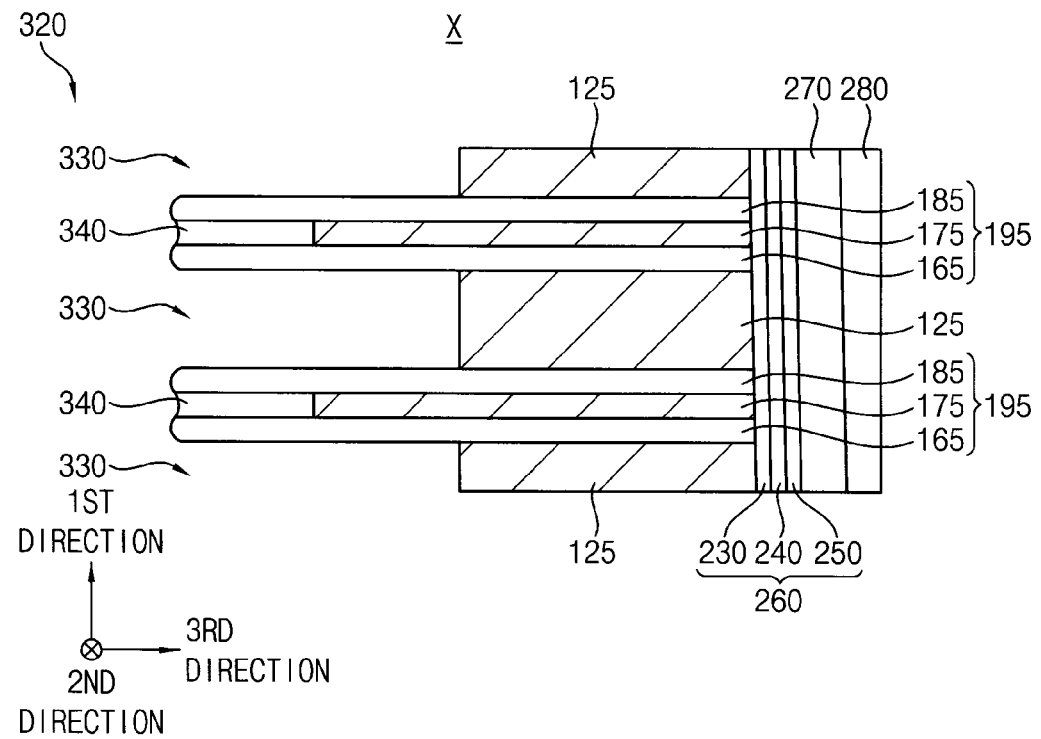

Referring to FIG. 11, a fifth sacrificial layer may be conformally formed on inner walls of the third and fourth recesses 330 and 335 and sidewalls of the end portions of the second and fourth sacrificial patterns 165 and 185, and may be partially removed by a trimming process to form a fifth sacrificial pattern 340 in the fourth recess 335. Thus, a sidewall of an end portion in the third direction of the third sacrificial pattern 175 having a reduced length in the third direction may be at least partially covered by the fifth sacrificial pattern 340.

The fifth sacrificial pattern 340 may include a material having an etching selectivity with respect to the third sacrificial pattern 175, e.g., an oxide such as silicon oxide, and thus in some cases, the fifth sacrificial pattern 340 may be merged to the second and fourth sacrificial patterns 165 and 185. The trimming process may be performed by a wet etching process using hydrofluoric acid (HF) as an etchant.

Figure 12:
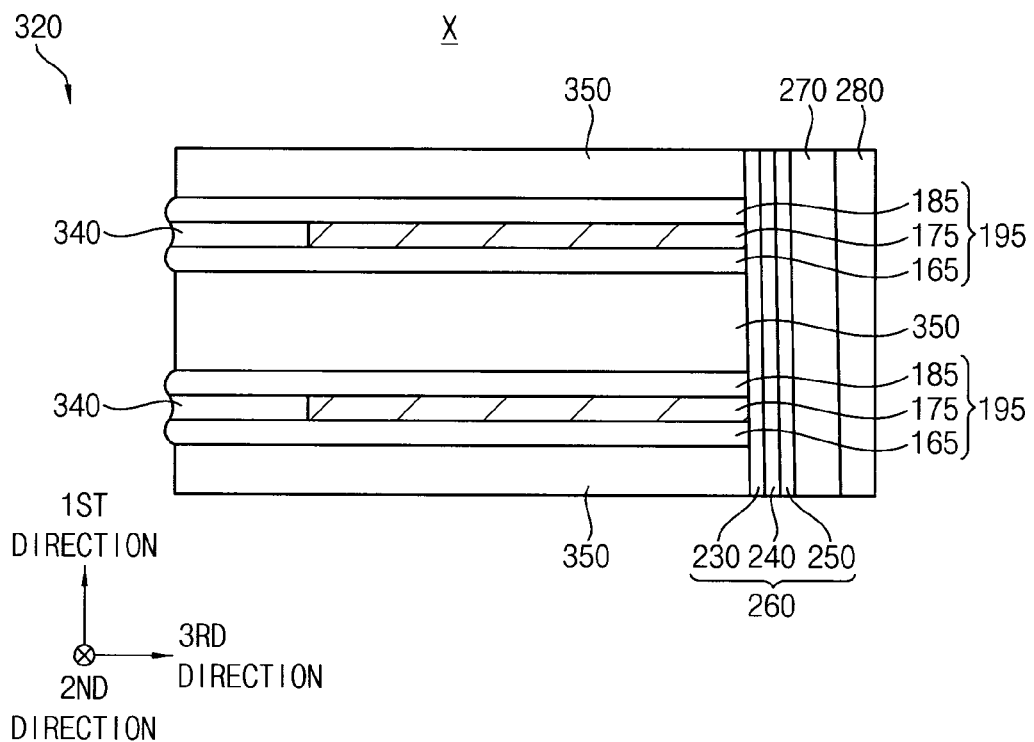

Referring to FIG. 12, a remaining portion of the first sacrificial pattern 125 may be removed to enlarge the third recess 330 in the third direction and expose a sidewall of the first blocking layer 230. A sixth sacrificial pattern 350 may be formed in the enlarged third recess 330.

The first sacrificial pattern 125 may be removed by a wet etching process using phosphoric acid ($H_3PO_4$) as an etchant, and during the wet etching process, the third sacrificial pattern 175 may be at least partially covered by the second, fourth and fifth sacrificial patterns 165, 185 and 340 so as not to be removed.

The sixth sacrificial pattern 350 may be formed by forming a sixth sacrificial layer on the substrate 100 to fill the third recess 330, and partially removing the sixth sacrificial layer through, e.g., an etch back process until the end portions in the third direction of the second and fourth sacrificial patterns 165 and 185 may be exposed.

The sixth sacrificial pattern 350 may include a material having an etching selectivity with respect to the second, fourth and fifth sacrificial patterns 165, 185 and 340, e.g., polysilicon.

Figure 13:
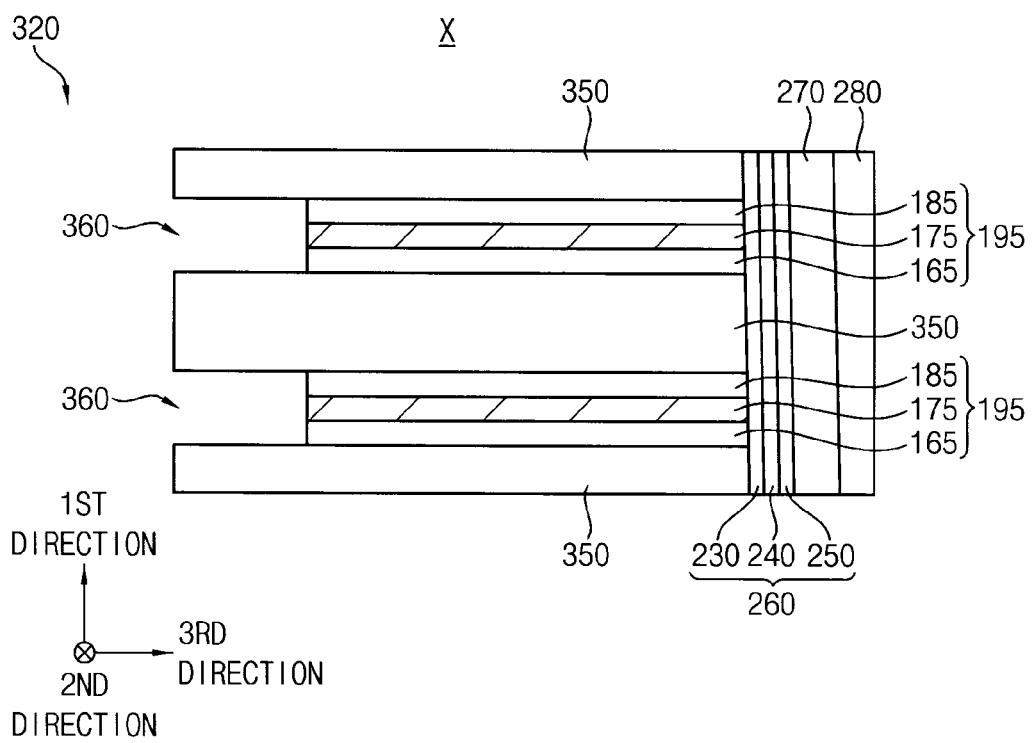

Referring to FIG. 13, the fifth sacrificial pattern 340 may be removed to form a second opening 360 exposing the end portion in the third direction of the third sacrificial pattern 175.

The fifth sacrificial pattern 340 may be removed by a wet etching process using, e.g., hydrofluoric acid (HF), and portions of the second and fourth sacrificial patterns 165 and 185 adjacent the fifth sacrificial pattern 340 in the first direction may also be removed. As the second opening 360 is formed, lower and upper surfaces of an end portion in the third direction of the sixth sacrificial pattern 350 may be exposed.

Figure 14:
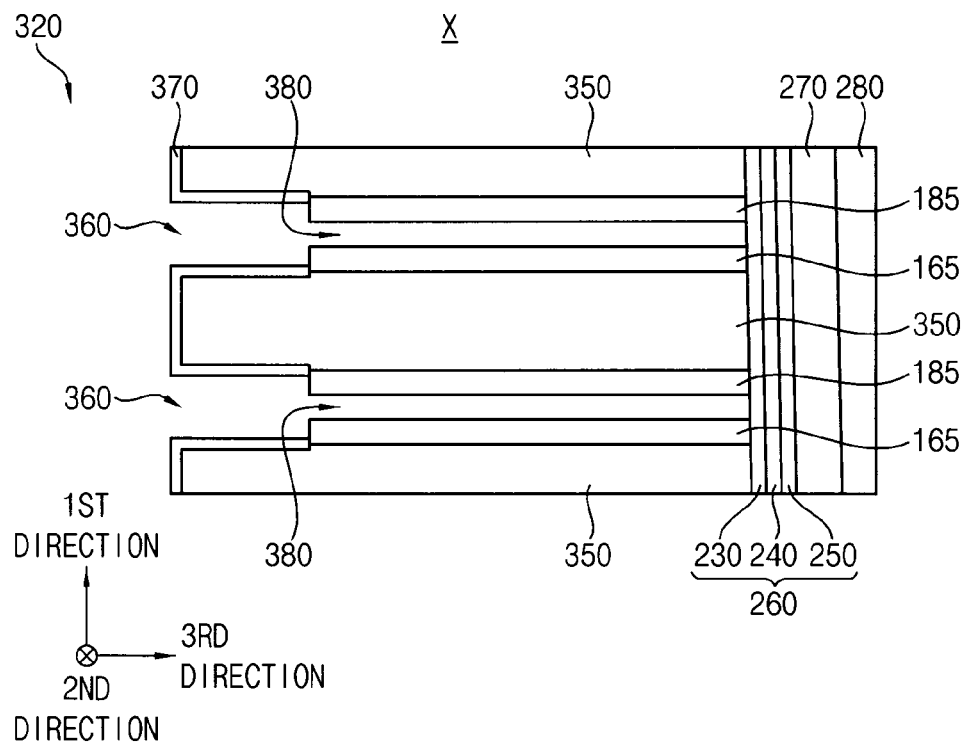

Referring to FIG. 14, the exposed lower and upper surfaces and a sidewall of the end portion of the sixth sacrificial pattern 350 may be oxidized by a wet oxidation process or a dry oxidation process to form a first etch stop layer 370, and the third sacrificial pattern 175 may be removed to form a third opening 380 exposing a sidewall of the first blocking layer 230.

The first etch stop layer 370 may include, e.g., silicon oxide, and the third sacrificial pattern 175 may be removed by a wet etching process using, e.g., phosphoric acid ($H_3PO_4$). During the wet etching process, the sixth sacrificial pattern 350 may be at least partially covered by the first etch stop layer 370 and the second and fourth sacrificial patterns 165 and 185 so as not to be removed.

Figure 15:
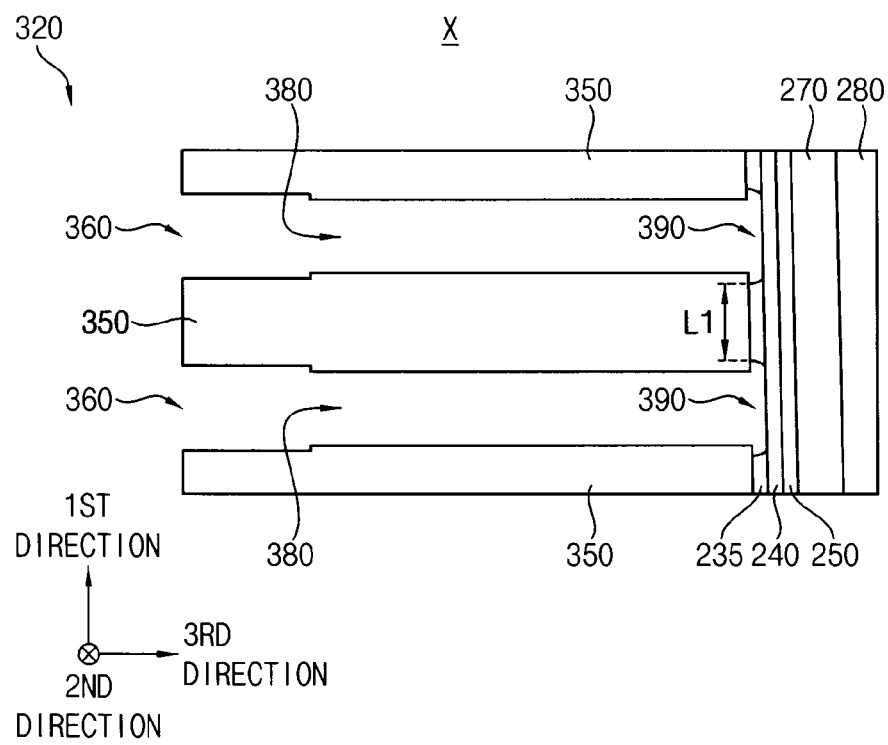

Referring to FIG. 15, the second and fourth sacrificial patterns 165 and 185 may be removed to enlarge the third opening 380 in the first direction, and a portion of the first blocking layer 230 exposed by the enlarged third opening 380 may be removed so that the first blocking layer 230 extending in the first direction may be divided into a plurality of first blocking patterns 235 spaced apart from each other in the first direction.

The second and fourth sacrificial patterns 165 and 185 and the exposed portion of the first blocking layer 230 may be removed by a wet etching process using, e.g., hydrofluoric acid (HF), and the first etch stop layer 370 may also be removed. As the exposed portion of the first blocking layer 230 is removed, a fourth opening 390 connected to the third opening 380 and exposing a sidewall of the charge trapping layer 240 may be formed.

In exemplary embodiments of the present disclosure, the wet etching process may be an isotropic etching process, and thus a width in the first direction of the fourth opening 390 may have a maximum value at an entrance connected to the third opening 380, and may gradually decrease toward the charge trapping layer 240 in the third direction.

In exemplary embodiments of the present disclosure, a first length L1 in the first direction of the first blocking patterns 235 between neighboring ones of the fourth openings 390 in the first direction may have a minimum value at an outer sidewall of the first blocking pattern 235 facing the sixth sacrificial pattern 350, and may have a maximum value at an inner sidewall of the first blocking pattern 235 facing the charge trapping layer 240. For example, the first length L1 of the first blocking pattern 235 may gradually increase from the sixth sacrificial pattern 350 toward the charge trapping layer 240 in a horizontal direction substantially parallel to the upper surface of the substrate 100, and an absolute value of a slope of each of lower and upper surfaces of the first blocking pattern 235 with respect to the upper surface of the substrate 100 may gradually increase from the sixth sacrificial pattern 350 toward the charge trapping layer 240 in the horizontal direction.

As the second and fourth sacrificial patterns 165 and 185 and the first etch stop layer 370 are removed, a sidewall and lower and upper surfaces of the sixth sacrificial pattern 350 may be exposed.

Figure 16:
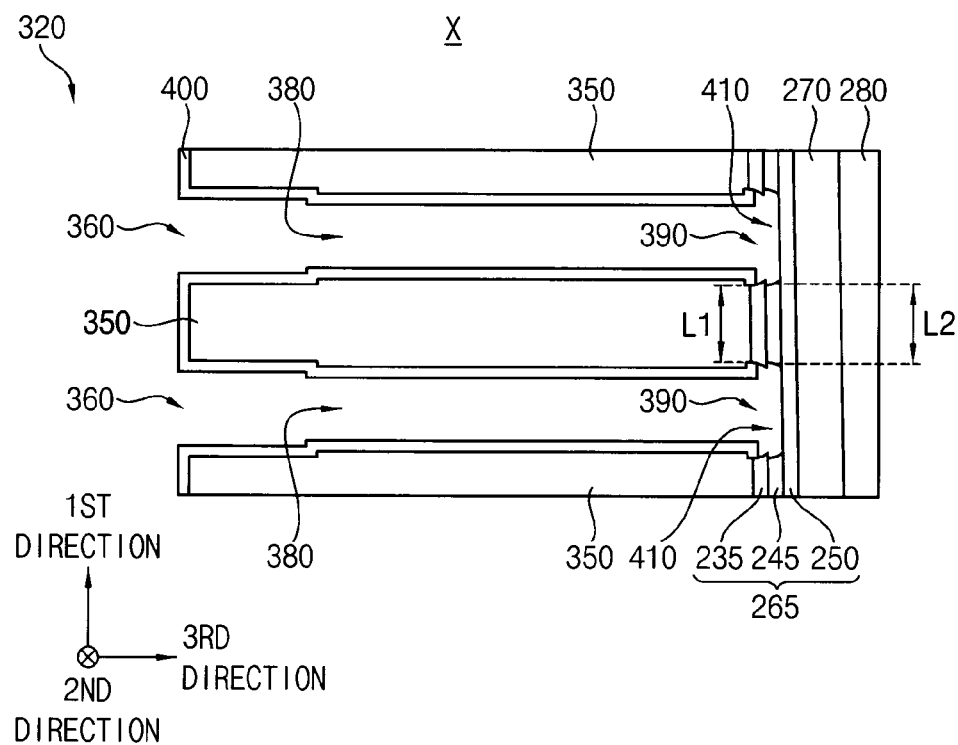

Referring to FIG. 16, the exposed sidewall and the lower and upper surfaces of the sixth sacrificial pattern 350 may be oxidized by a wet oxidation process or a dry oxidation process to form a second etch stop layer 400 including, e.g., silicon oxide, and the exposed portion of the charge trapping layer 240 by the fourth opening 390 may be removed.

Thus, the charge trapping layer 240 extending in the first direction may be divided into a plurality of charge trapping patterns 245 spaced apart from each other in the first direction. Hereinafter, the tunnel insulation layer 250 extending in the first direction, the charge trapping patterns 245 spaced apart from each other in the first direction, and the first blocking patterns 235 spaced apart from each other in the first direction may be altogether referred to as a charge storage structure 265.

The exposed portion of the charge trapping layer 240 may be removed by a wet etching process, using e.g., phosphoric acid ($H_3PO_4$) as an etchant, and a fifth opening 410 connected to the fourth opening 390 and partially exposing a sidewall of the tunnel insulation layer 250 may be formed.

In exemplary embodiments of the present disclosure, the wet etching process may be an isotropic etching process, and thus a width in the first direction of the fifth opening 410 may have a maximum value at an entrance connected to the fourth opening 390, and may gradually increase toward the tunnel insulation layer 250 in the third direction.

In exemplary embodiments of the present disclosure, a second length L2 in the first direction of the charge trapping pattern 245 between neighboring ones of the fifth openings 410 in the first direction may have a minimum value at an outer sidewall of the charge trapping pattern 245 facing the first blocking pattern 235, and may have a maximum value at an inner sidewall of the charge trapping pattern 245 facing the tunnel insulation layer 250. For example, the second length L2 of the charge trapping pattern 235 may gradually increase from the first blocking pattern 235 toward the tunnel insulation layer 250 in the horizontal direction, and an absolute value of a slope of each of lower and upper surfaces of the charge trapping pattern 245 with respect to the upper surface of the substrate 100 may gradually increase from the first blocking pattern 235 toward the tunnel insulation layer 250 in the horizontal direction.

Figure 17:
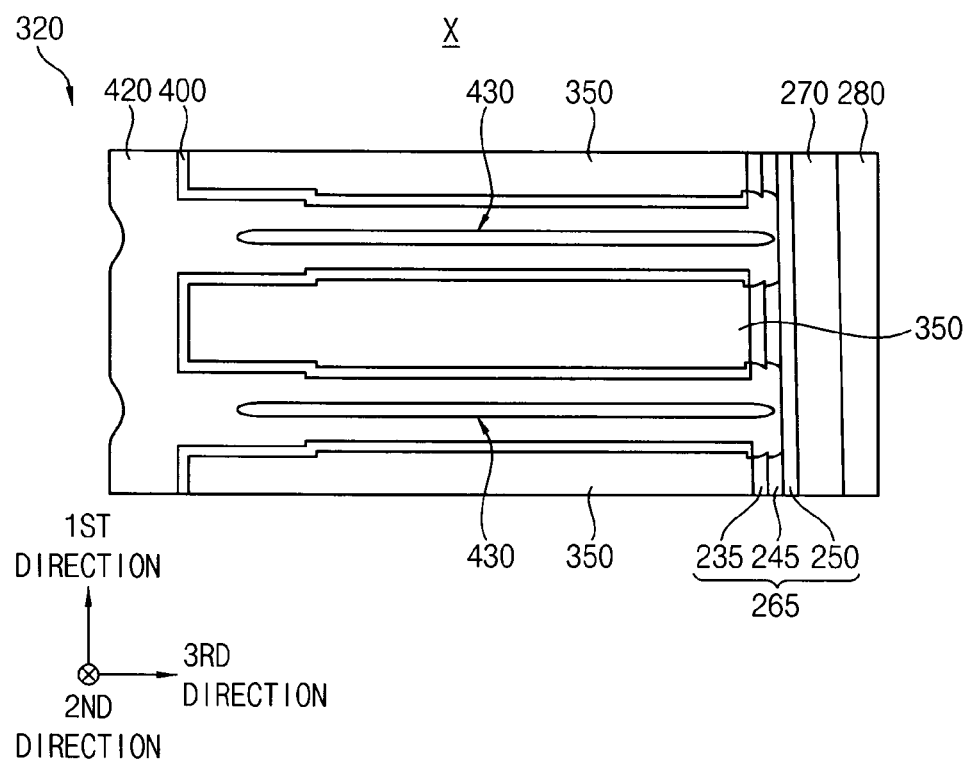

Referring to FIG. 17, a second insulation layer 420 may be formed to fill the third to fifth openings 380, 390 and 410 by a deposition process through the first opening 320, and an air gap 430 may be formed between neighboring ones of the sixth sacrificial patterns 350 in the first direction.

The second insulation layer 420 may include an oxide, e.g., silicon oxide. The second insulation layer 420 may or might not be merged with the second etch stop layer 400 on the sidewall and the lower and upper surfaces of the sixth sacrificial pattern 350.

The shape, location and size of the air gap 430 may be varied according to the conditions of the deposition process of the second insulation layer 420. In an exemplary embodiment of the present disclosure, the air gap 430 might not expose a sidewall of the tunnel insulation layer 250, but rather, an end of the air gap 430 may be formed between neighboring ones of the charge trapping patterns 245 in the first direction.

Figure 18:
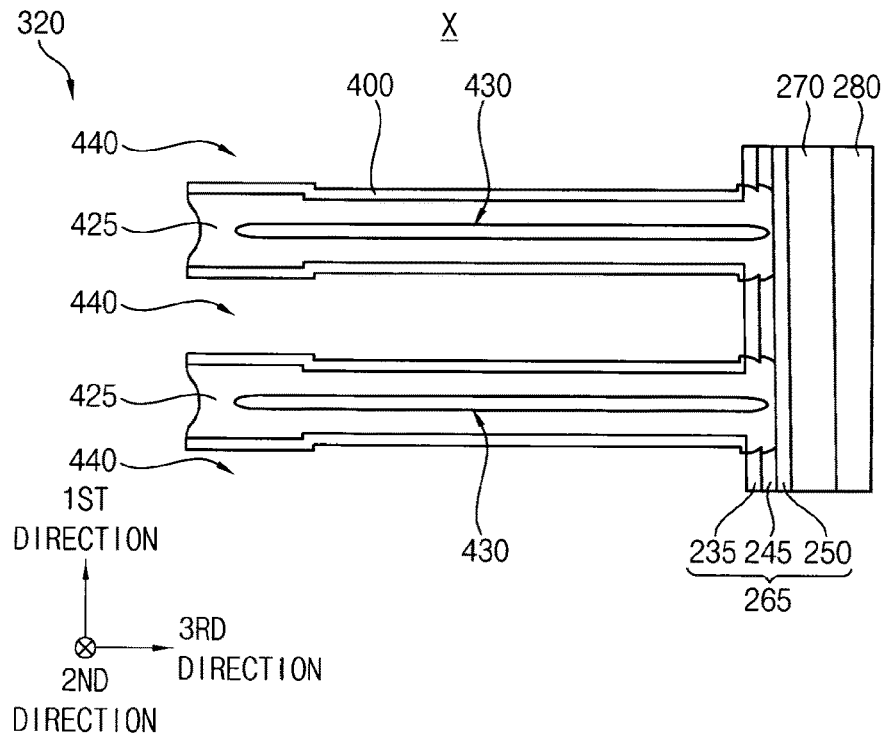

Referring to FIG. 18, the second insulation layer 420 and the second etch stop layer 400 may be partially removed until a sidewall of an end portion of the six sacrificial pattern 350 in the third direction may be exposed to form a second insulation pattern 425 in the third to fifth openings 380, 390, 410 (refer to FIG. 16), and a third insulation pattern 427 (refer to FIG. 20) may be formed on sidewalls of end portions in the third direction of the first insulation pattern 115 and/or the first and second insulating interlayers 220 and 310. However, in some cases, the third insulation pattern 427 may be merged to the first insulation pattern 115 and/or the first and second insulating interlayers 220 and 310.

The second insulation layer 420 and the second etch stop layer 400 may be partially removed by a wet etching process using, e.g., hydrofluoric acid (HF) as an etchant. By the wet etching process, the second etch stop layer 400 may at least partially cover only lower and upper surfaces of the sixth sacrificial pattern 350, and a sidewall of an end portion of the sixth sacrificial pattern 350 in the third direction may be exposed.

The exposed sixth sacrificial pattern 350 may be removed by a wet etching process using, e.g., phosphoric acid ($H_3PO_4$) as an etchant to form a sixth opening 440 exposing an outer sidewall of the first blocking pattern 235.

Figure 19:
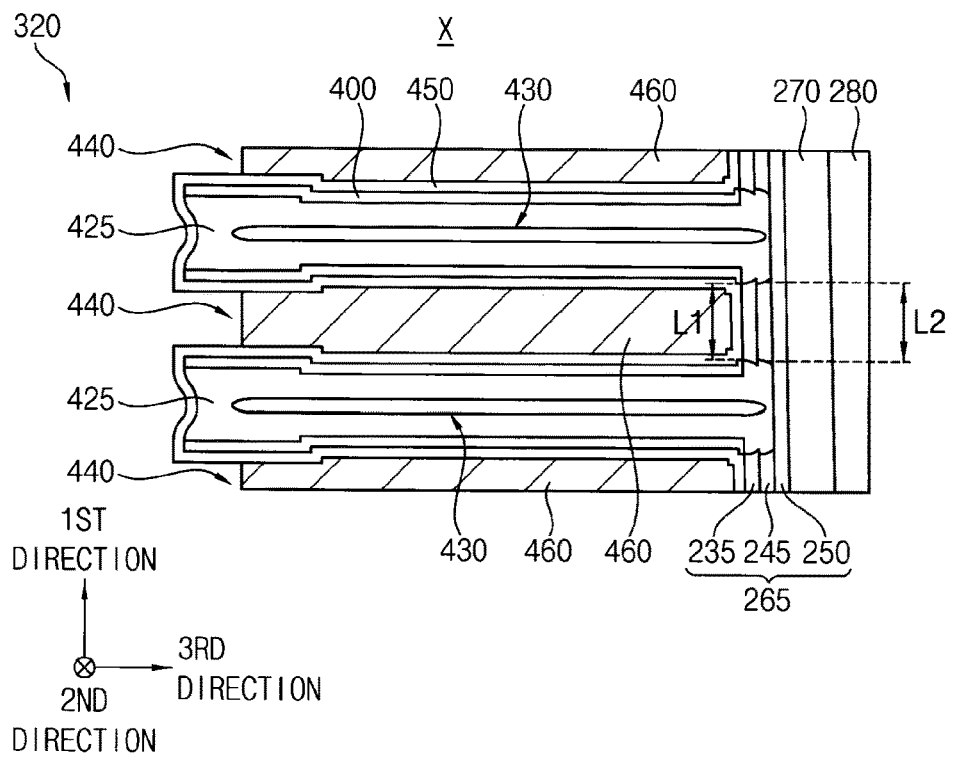

Referring to FIG. 19, a second blocking layer 450 may be formed on a sidewall of the sixth opening 440, the exposed outer sidewall of the first blocking pattern 235, and sidewalls of end portions in the third direction of the second insulation pattern 425 and the second etch stop layer 400, and a gate electrode 460 may be formed in the sixth opening 440.

Figure 20:
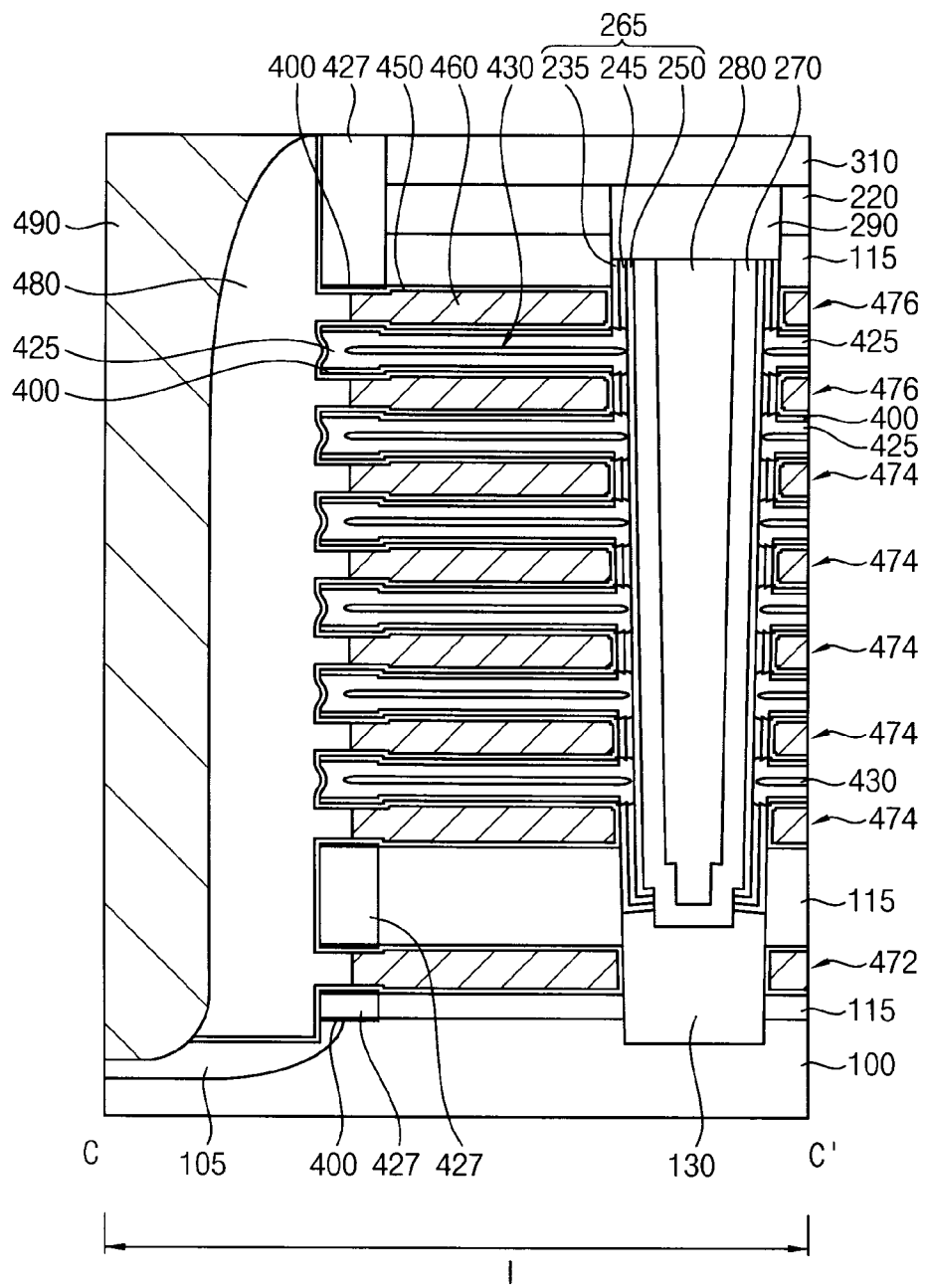

Referring to FIG. 20, the second blocking layer 450 may also be formed on sidewalls of the third insulation pattern 427 and the first and second insulating interlayers 220 and 310, an upper surface of the second insulating interlayer 310, and the upper surface of the substrate 100 exposed by the first opening 320. The second blocking layer 450 may include a metal oxide having a high dielectric constant, e.g., aluminum oxide, hafnium oxide, etc.

The gate electrode 460 may be formed by forming a gate electrode layer on the second blocking layer 450 to fill a remaining portion of the sixth opening 440 and partially removing the gate electrode layer through, e.g., a wet etching process. The gate electrode layer may include a gate barrier layer and a gate conductive layer sequentially stacked, and thus the gate electrode 460 may include a gate conductive pattern and a gate barrier pattern covering lower and upper surfaces and a sidewall of the gate conductive pattern. The gate conductive pattern may include a metal having a low resistance, e.g., tungsten, titanium, tantalum, platinum, etc., and the gate barrier pattern may include a metal nitride, e.g., titanium nitride, tantalum nitride, etc.

In exemplary embodiments of the present disclosure, the gate electrode 460 may extend in the second direction, and a plurality of gate electrodes 460 may be formed in the first direction. Additionally, a plurality of gate electrodes 460 may be formed in the third direction. For example, the gate electrodes 460 each of which may extend in the second direction may be spaced apart from each other by the first opening 320. The gate electrodes 460 may include first, second and third gate electrodes 472, 474 and 476 sequentially stacked in the first direction.

Referring to FIG. 20, a second spacer layer may be formed on the second blocking layer 450, and anisotropically etched to form a second spacer 480 on a sidewall of the first opening 320.

The second spacer 480 may include an oxide, e.g., silicon oxide.

A conductive layer may be formed on the substrate 100, for example, an upper surface of the impurity region 105, the second spacer 480 and the second blocking layer 450, and may be planarized until the upper surface of the second insulating interlayer 310 may be exposed to from a common source pattern (CSP) 490. A portion of the second blocking layer 450 on the upper surface of the second insulating interlayer 310 may also be removed.

The CSP 490 may extend in the second direction, and a plurality of CSPs 490 may be spaced apart from each other in the third direction. The CSP 490 may include a metal, a metal nitride, a metal silicide, etc., and in some cases, the CSP 490 might not be formed. The CSP 490 and the second spacer 480 covering each of opposite sidewalls in the third direction of the CSP 490 may form a division structure.

Figure 21:
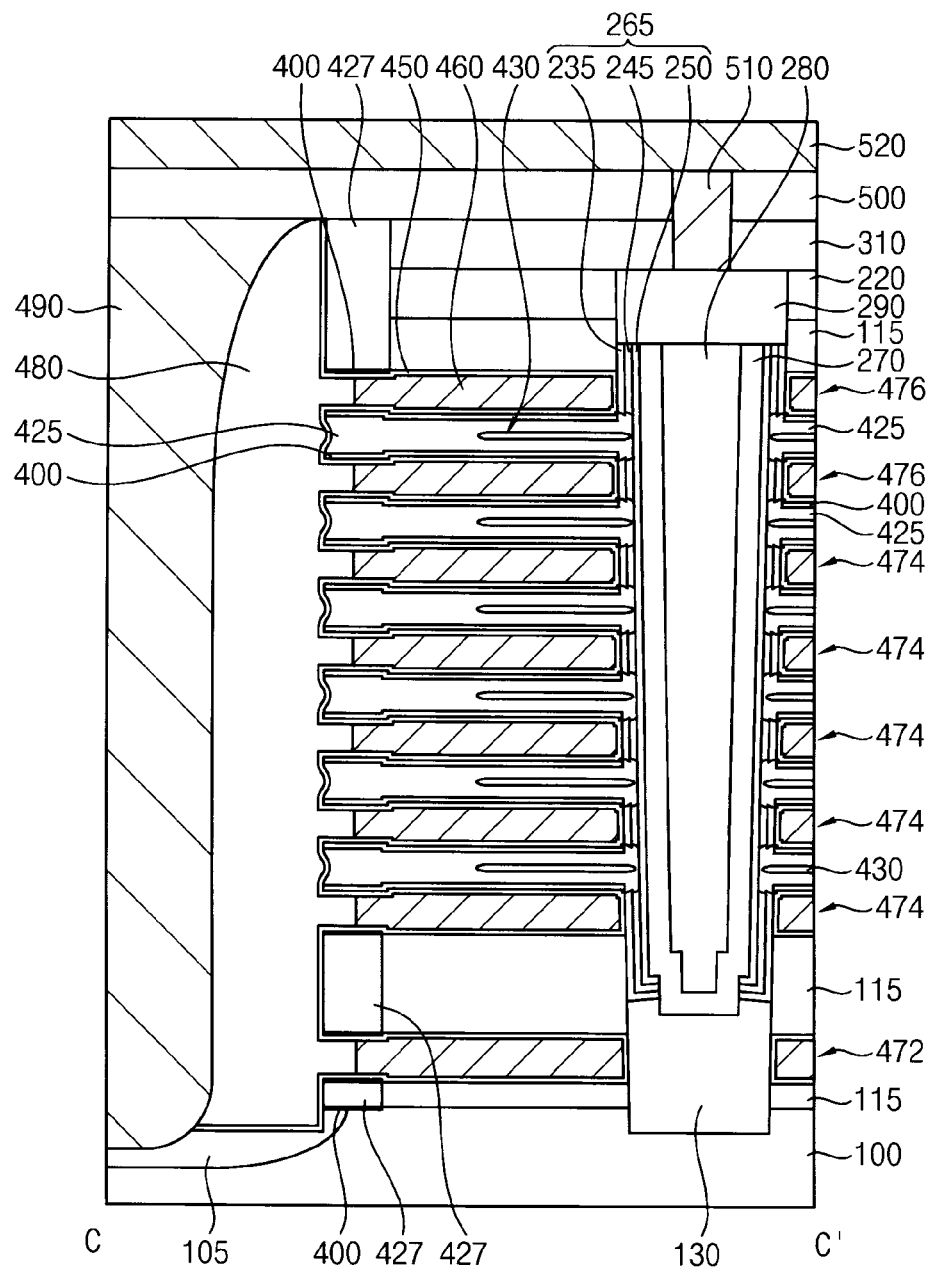

Referring to FIG. 21, a third insulating interlayer 500 may be formed on the second insulating interlayer 310, the division structure, and the second blocking layer 450, and a contact plug 510 may be formed through the second and third insulating interlayers 310 and 500 to contact an upper surface of the capping pattern 290.

A bit line 520 may be formed to contact an upper surface of the contact plug 510 so that the vertical memory device may be manufactured. In exemplary embodiments of the present disclosure, the bit line 520 may be formed in the third direction, and a plurality of bit lines 520 may be spaced apart from each other in the second direction.

As illustrated above, the second sacrificial layer structure 190 having the second and fourth sacrificial layers 160 and 180 including the same material as the first blocking layer 230 and the third sacrificial layer including the same material as the charge trapping layer 240 may be formed between the first sacrificial layers 120 for forming the gate electrodes 460, and the first blocking layer 230 and the charge trapping layer 240 may be partially removed when the second sacrificial layer structure 190 is removed to form the third opening 380, so that each of the first blocking layer 230 and the charge trapping layer 240 may be divided into a plurality of pieces spaced apart from each other in the first direction. Additionally, the second insulation layer 420 may be formed to fill the third opening 380 so that the air gap 430 may be formed in the second insulation layer 420.

Accordingly, the second insulation pattern 425 including the air gap 430 may be formed between the gate electrodes 460 substituted for the first sacrificial layers 120, respectively, and thus, even if different voltages are applied to neighboring ones of the gate electrodes 460 in the first direction, the breakdown of the insulative characteristic of the second insulation pattern 425 between the gate electrodes 460 may decrease. As a result, the second insulation pattern 425 may be relatively thin in the first direction, and the increase of the height of the vertical memory device including the second insulation pattern 425 may be prevented even with a large stack number of the gate electrodes 460 in the first direction.

Additionally, a plurality of charge trapping patterns 245 may be adjacent to a plurality of gate electrodes 460, respectively, instead that the charge trapping layer 240 extending in the first direction is commonly adjacent to the plurality of gate electrodes 460, and thus the deterioration of retention characteristic of the vertical memory device due to the movement of charges in the first direction by the gate electrodes 460 at different levels may be prevented.

Referring to FIGS. 8, 19 and 21 again, the vertical memory device may include the first pillar structure extending in the first direction on the substrate 100, a gate electrode structure including the gate electrodes 460, each of which may surround the first pillar structure, spaced apart from each other in the first direction on the substrate 100, the second insulation pattern 425 including the air gap 430 between the gate electrodes 460, the second blocking layer 450 covering lower and upper surfaces and a sidewall facing the first pillar structure of each of the gate electrodes 460, the division structure extending in the second direction on the substrate 100 and contacting an end portion of the gate electrode structure in the third direction, and the bit line 520 extending in the third direction on the gate electrode structure and being electrically connected to the channel 270. The vertical memory device may further include the second etch stop layer 400, the first and third insulation patterns 115 and 427, the first division layer 300, the first to third insulating interlayers 220, 310 and 500, and the contact plug 510.

The first pillar structure may include the semiconductor pattern 130 on the substrate 100, the channel 270 having a cup-like shape on the semiconductor pattern 130, the charge storage structure 260 covering an outer sidewall of the channel 270, the filling pattern 280 filling an inner space formed by the channel 270, and the capping pattern 290 on the channel 270, the charge storage structure 260 and the filling pattern 280. The charge storage structure 260 may include the tunnel insulation layer 250, the charge trapping pattern 245 and the first blocking pattern 235 sequentially stacked between the outer sidewall of the channel 270 and each of the gate electrodes 460.

In exemplary embodiments of the present disclosure, a plurality of first blocking patterns 235 may face the gate electrodes 460, respectively, in the horizontal direction to be spaced apart from each other in the first direction. The first length L1 in the first direction of each of the first blocking patterns 235 may be less at the outer sidewall thereof facing the gate electrodes 460 than at the inner sidewall thereof facing the charge trapping pattern 245. In exemplary embodiments of the present disclosure, the first length L1 of each of the first blocking patterns 235 may gradually increase from the gate electrode 460 toward the charge trapping pattern 245 in the horizontal direction, and the absolute values of the slopes of lower and upper surfaces of each of the first blocking patterns 235 with respect to the upper surface of the substrate 100 may gradually increase in the horizontal direction.

In exemplary embodiments of the present disclosure, a plurality of charge trapping patterns 245 may face the gate electrodes 460, respectively, to be spaced apart from each other in the first direction. The second length L2 in the first direction of each of the charge trapping patterns 245 may be least at the outer sidewall thereof facing the first blocking pattern 235 and may be greatest at the inner sidewall thereof facing the tunnel insulation layer 250. For example, the second length L2 of each of the charge trapping patterns 245 may gradually increase from the first blocking pattern 235 toward the tunnel insulation layer 250 in the horizontal direction, and the absolute values of the slopes of lower and upper surfaces of each of the charge trapping patterns 245 with respect to the upper surface of the substrate 100 may gradually increase in the horizontal direction.

In exemplary embodiments of the present disclosure, a plurality of first pillar structures may be formed in each of the second and third directions to define a first pillar structure array, which may be formed by the channel array including the channels 270 in each of the first pillar structures.

The gate electrode structure may include the first to third gate electrodes 472, 474 and 476 at a plurality of levels, respectively, in the first direction, each of which may extend in the second direction.

In exemplary embodiments of the present disclosure, the gate electrode structure may include at least one first gate electrode 472, a plurality of second gate electrodes 474, and at least one third gate electrode 476 sequentially stacked in the first direction on the upper surface of the substrate 100. The first gate electrode 472 may serve as a ground selection line (GSL), each of the second gate electrodes 474 may serve as a word line, and the third gate electrode 476 may serve as a string selection line (SSL).

In exemplary embodiments of the present disclosure, the second insulation pattern 425 may be formed between the second gate electrodes 474 and between the second and third gate electrodes 474 and 476, and the second insulation pattern 425 may include the air gap 430 therein. The first insulation pattern 115 having no air gap therein may be formed between the first and second gate electrodes 472 and 474 and between the substrate 100 and the first gate electrode 472.

A plurality of gate electrode structures may be spaced apart from each other in the third direction by the division structures. In exemplary embodiments of the present disclosure, the gate electrode structure may form a staircase structure of which a length in the second direction may decrease from a lowermost level toward an uppermost level in the first direction.

The division structure may include the CSP 490 extending in the second direction on the substrate 100 and the second spacer 480 covering each of opposite sidewalls of the CSP 490 in the third direction.

The second blocking layer 450 may at least partially cover a sidewall of an end portion of the second insulation pattern 425 in the third direction, and thus may extend in the first direction to be adjacent to the division structure.

The second etch stop layer 400 may at least partially cover the lower and upper surfaces of the second insulation pattern 425, and might not cover lower and upper surfaces of a portion of the second insulation pattern 425 between the charge trapping patterns 245. The second etch stop layer 400 may be merged to the second insulation pattern 425, or may be distinguished therefrom.

FIGS. 22 to 27 are cross-sectional views illustrating a method of manufacturing a vertical memory device in accordance with exemplary embodiments of the present disclosure, which may be cross-sectional views taken along lines C-C' of corresponding plan views, respectively. FIGS. 22 to 26 are enlarged cross-sectional views of the region X of FIG. 9.

This method may include processes substantially the same as or similar to those illustrated with reference to FIGS. 1 to 22, and repetitive explanations thereon are omitted herein.

Figure 22:
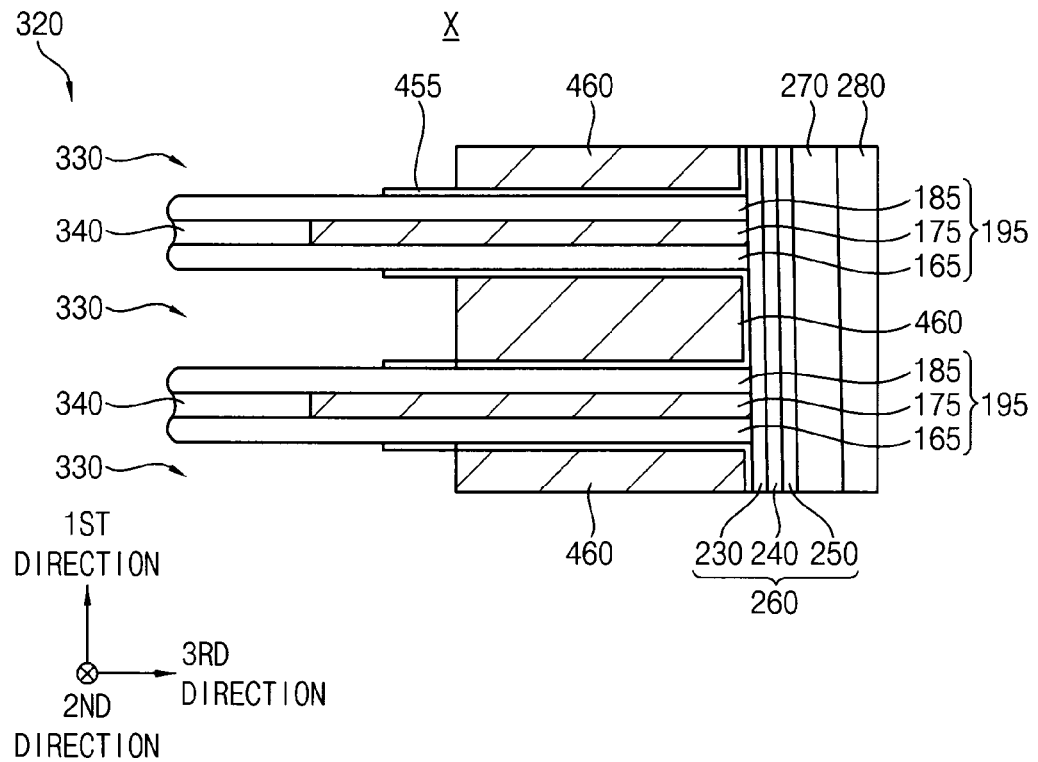
FIGS. 22 to 27 are cross-sectional views illustrating a method of manufacturing a vertical memory device in accordance with exemplary embodiments of the present disclosure, in which cross-sectional views are taken along lines C-C' of corresponding plan views.

Referring to FIG. 22, processes substantially the same as or similar to those illustrated with reference to FIGS. 1 to 1 may be performed, and processes substantially the same as or similar to those illustrated with reference to FIG. 19 may be performed.

Particularly, the first sacrificial pattern 125 may be removed to enlarge the third recess 330 in the third direction, a second blocking pattern 455 may be formed on each of opposite sidewalls in the first direction of the enlarged third recess 330 and the exposed outer sidewall of the first blocking layer 230, and the gate electrode 460 may be formed in the third recess 330.

In exemplary embodiments of the present disclosure, the second blocking pattern 455 and the gate electrode 460 may be formed by forming a second blocking layer 450 on the sidewalls of the third recess 330 in the first direction, the exposed outer sidewall of the first blocking layer 230, and the sidewalls of the end portions in the third direction of the second, fourth and fifth sacrificial patterns 165, 185 and 340, forming the gate electrode layer on the second blocking layer 450 to fill the third recess 330, partially removing the gate electrode layer to expose a portion of the second blocking layer 450, removing the exposed portion of the second blocking layer 450, for example, portions of the second blocking layer 450 on the sidewall and the lower and upper surfaces of the end portions in the third direction of the second, fourth and fifth sacrificial patterns 165, 185 and 340, and partially removing the gate electrode layer to further expose a portion of the second blocking layer 450.

Thus, a length in the third direction of a portion of the second blocking pattern 455 on the lower surface of the second sacrificial pattern 165 or on the upper surface of the fourth sacrificial pattern 185 may be less than a length in the third direction of the third sacrificial pattern 175 between the second and fourth sacrificial patterns 165 and 185, and may be greater than a length in the third direction of the gate electrode 460.

Figure 23:
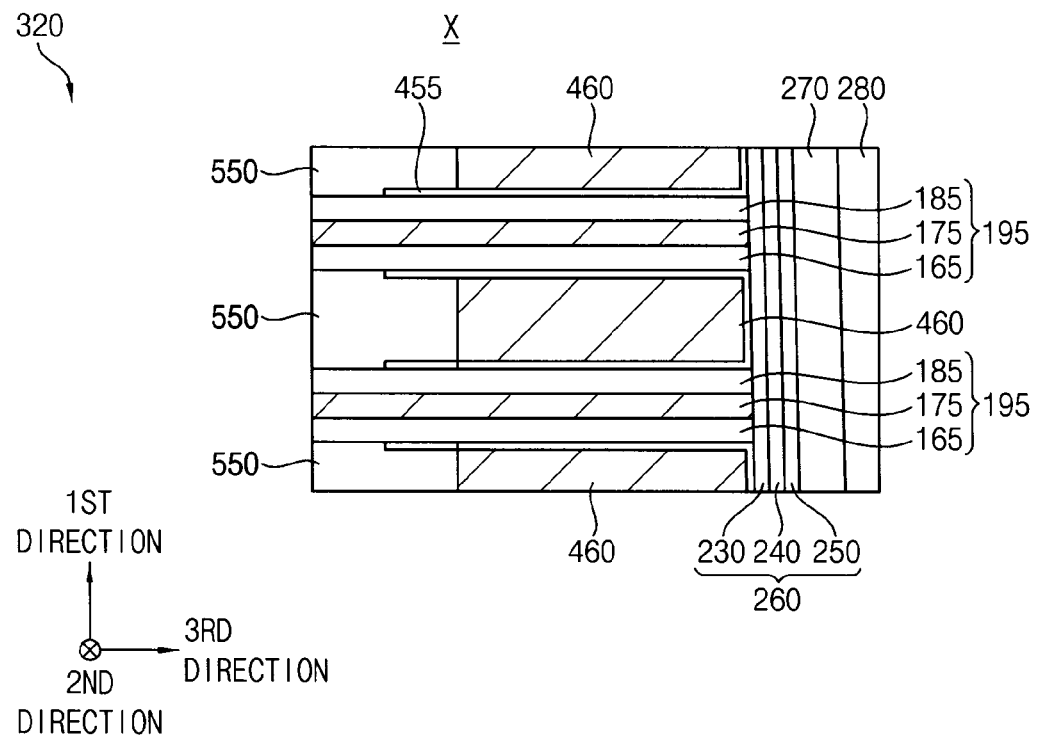

Referring to FIG. 23, a protection layer 550 may be formed on the substrate 100 to fill a remaining portion of the third recess 330, and the second, fourth and fifth sacrificial patterns 165, 185 and 340 and the protection layer 550 may be partially removed until the sidewall of the end portion in the third direction of the third sacrificial pattern 175 may be exposed.

The protection layer 550 may include an oxide, e.g., silicon oxide, and thus, in some cases, may be merged to the second and fourth sacrificial patterns 165 and 185.

Figure 24:
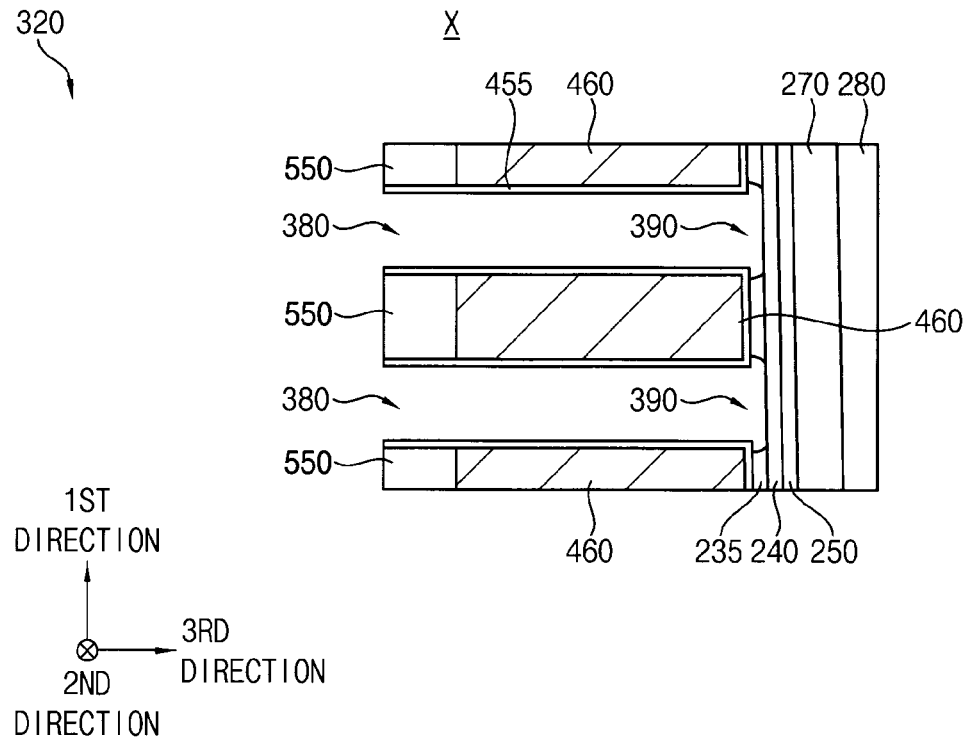

Referring to FIG. 24, processes substantially the same as or similar to those illustrated with reference to FIGS. 14 and 15 may be performed so that the second sacrificial structure 195 may be removed to form the third and fourth openings 380 and 390 and that the first blocking layer 230 may be divided into the first blocking patterns 235.

When the second sacrificial structure 195 is removed, the sixth sacrificial pattern 350 including polysilicon has not been formed, and thus the first etch stop layer 370 might not be formed.

When the second and fourth sacrificial patterns 165 and 185 are removed, the protection layer 550 might not be entirely removed but may partially remain, particularly, a portion of the protection layer 550 from the sidewall of the end portion in the third direction of the gate electrode 460 to an end portion in the third direction of the second blocking pattern 455 may remain. Thus, the protection layer 550 may at least partially cover the gate electrode 460.

Figure 25:
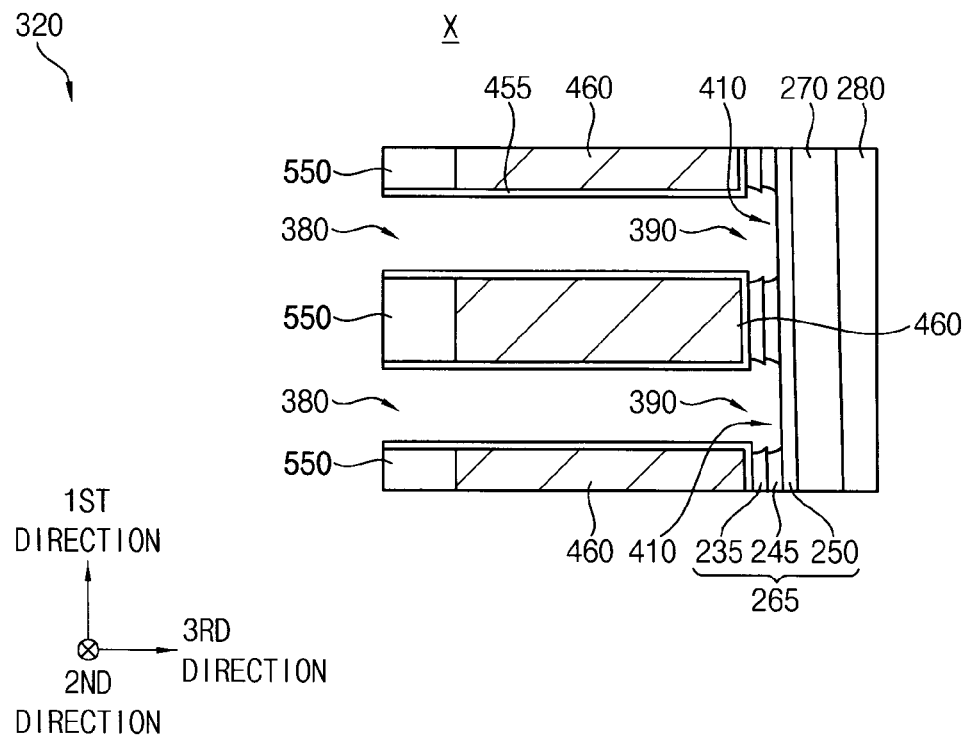

Referring to FIG. 25, processes substantially the same as or similar to those illustrated with reference to FIG. 16 may be performed so that the charge trapping layer 240 may be partially etched to form the fifth opening 410 and that the charge trapping layer 240 may be divided into the charge trapping patterns 245.

In exemplary embodiments of the present disclosure, when the second blocking pattern 455 includes, e.g., aluminum oxide, the etching process may be performed by a dry etching process using an etching gas having an etching selectivity between aluminum oxide and a nitride. Alternatively, when the second blocking pattern 455 includes, e.g., hafnium oxide, the etching process may be performed by a wet etching process using an etchant having an etching selectivity between hafnium oxide and a nitride, e.g., phosphoric acid ($H_3PO_4$) or hydrofluoric acid (HF). Thus, even though the second blocking pattern 455 is exposed, it might not be removed during the etching process.

Figure 26:
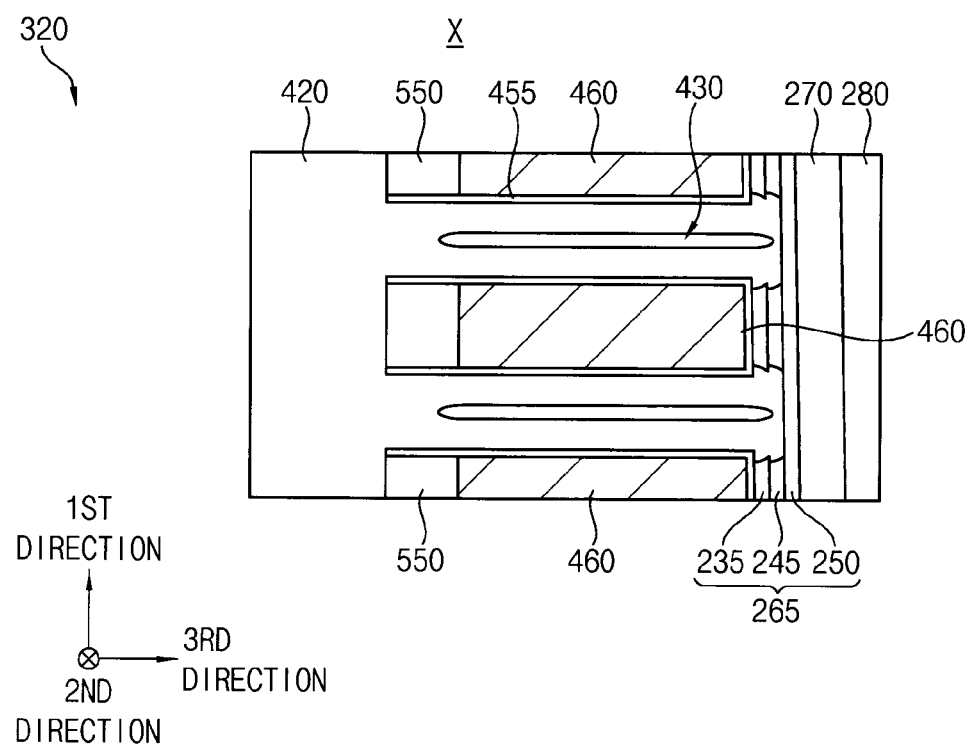

Referring to FIG. 26, processes substantially the same as or similar to those illustrated with reference to FIG. 17 may be performed so that the second insulation layer 420 may be formed to fill the third to fifth openings 380, 390 and 410 and that the air gap 430 may be formed between neighboring ones of the gate electrodes 460 in the first direction.

The second insulation layer 420 may include an oxide, e.g., silicon oxide, and thus may or might not be merged to the protection layer 550.

Figure 27:
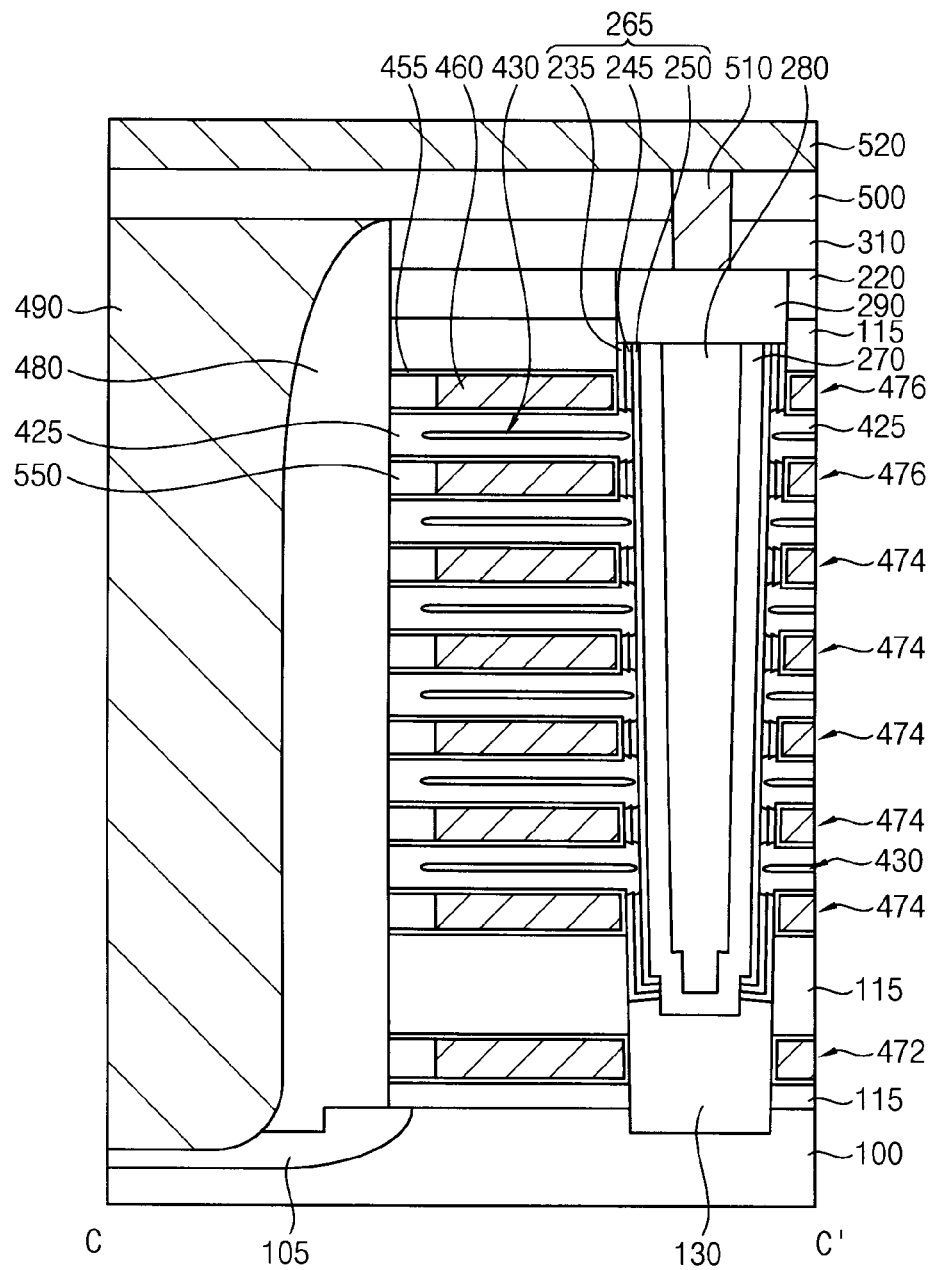
Figure 27:
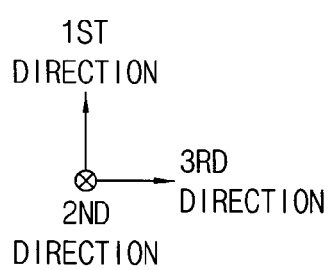

Referring to FIG. 27, processes substantially the same as or similar to those illustrated with reference to FIGS. 20 and 21 may be performed to complete the fabrication of the vertical memory device.

As illustrated above, unlike the method of manufacturing the vertical memory device illustrated with reference to FIGS. 1 to 21, the process for replacing the first sacrificial pattern 125 with the sixth sacrificial pattern 350 may be skipped and the first sacrificial pattern 125 may be directly replaced with the gate electrode 460, and thus the whole processes may be simplified. Additionally, the second insulation pattern 425 including the air gap 430 between the charge trapping patterns 245 spaced apart from each other in the first direction and between the gate electrodes 460 spaced apart from each other in the first direction may be easily formed.

The vertical memory device may have the following structural features unlike that of FIGS. 8, 19 and 21.

Particularly, the protection layer 550 may be formed on the sidewall of the end portion in the third direction of each of the gate electrodes 460, and the second etch stop layer 400 (refer to FIG. 21) might not be formed on the lower and upper surfaces of the second insulation pattern 425.

The second blocking pattern 455 may at least partially cover the lower and upper surfaces and the sidewall facing the charge storage structure 265 of each of the gate electrodes 460 and lower and upper surfaces of the protection layer 550. In exemplary embodiments of the present disclosure, end portions in the third direction of the second insulation pattern 425, the protection layer 550 and the second blocking pattern 455 may be aligned with each other in the first direction.

Figure 28:
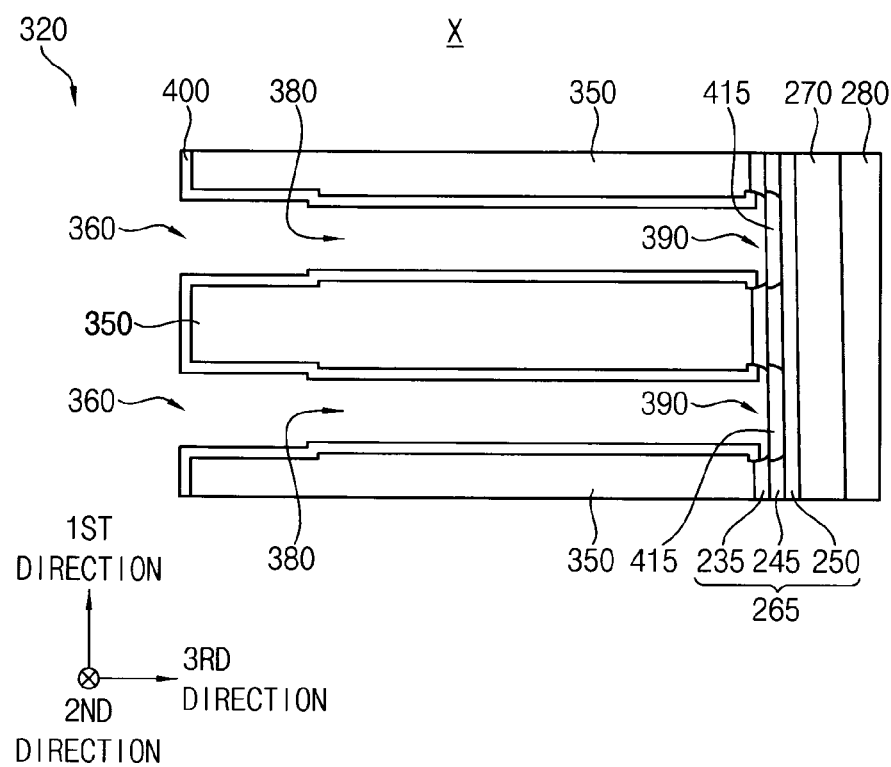
FIGS. 28 and 29 are cross-sectional views illustrating a method of manufacturing a vertical memory device in accordance with exemplary embodiments of the present disclosure, in which cross-sectional views are taken along lines C-C' of corresponding plan views.
Figure 29:
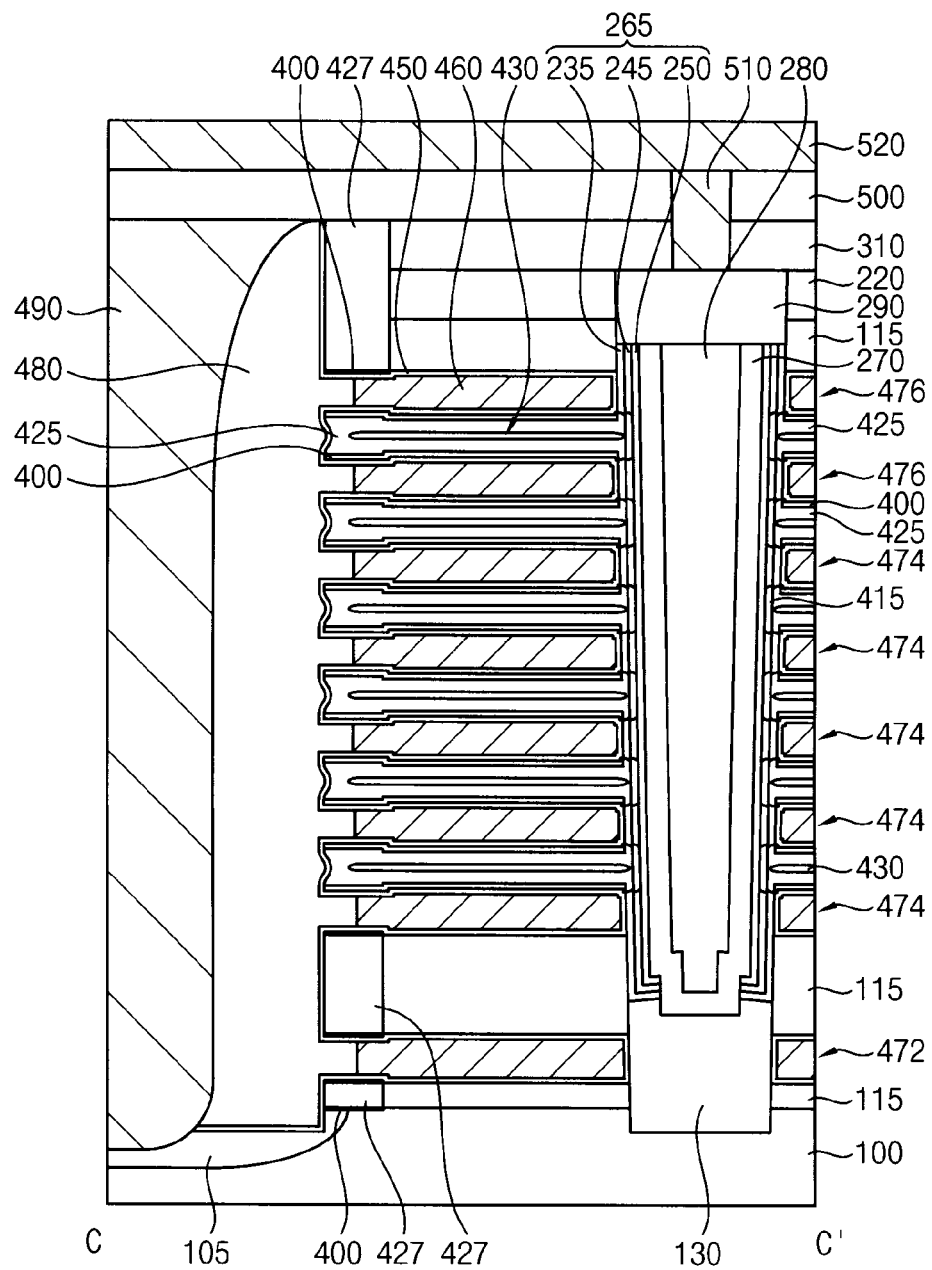

FIGS. 28 and 29 are cross-sectional views illustrating a method of manufacturing a vertical memory device in accordance with exemplary embodiments of the present disclosure, particularly, cross-sectional views taken along lines C-C' of corresponding plan views, respectively. FIG. 28 is an enlarged cross-sectional view of the region X of FIG. 9.

This method may include processes substantially the same as or similar to those illustrated with reference to FIG. 1 to 21, and repetitive explanations thereon are omitted herein.

Referring to FIG. 28, processes substantially the same as or similar to those illustrated with reference to FIGS. 1 to 15 may be performed, and a portion of the charge trapping layer 240 exposed by the fourth opening 390 may be oxidized instead of forming the fifth opening 410.

Thus, a portion of the charge trapping layer 240 adjacent the fourth opening 390 may be converted into a second division layer 415, and the charge trapping layer 240 extending in the first direction may be divided into the charge trapping patterns 245 spaced apart from each other in the first direction.

The oxidation process may include a dry oxidation process or a wet oxidation process, and the second division layer 415 formed by the oxidation process may include, e.g., silicon oxide or silicon oxynitride. In exemplary embodiments of the present disclosure, a width in the first direction of the second division layer 415 may be greatest at an entrance adjacent the fourth opening 390, and may gradually decrease toward the tunnel insulation layer 250 in the third direction.

Referring to FIG. 29, processes substantially the same as or similar to those illustrated with reference to FIGS. 17 to 21 may be performed to complete the fabrication of the vertical memory device.

The vertical memory device may have the features in that the charge trapping patterns 245 may be spaced apart from each other in the first direction not by the second insulation pattern 425 but by the second division 415, which may be different from the vertical memory device illustrated with reference to FIGS. 1 to 21.

This method may also be applied to that illustrated with reference to FIGS. 22 to 27.

Figure 30:
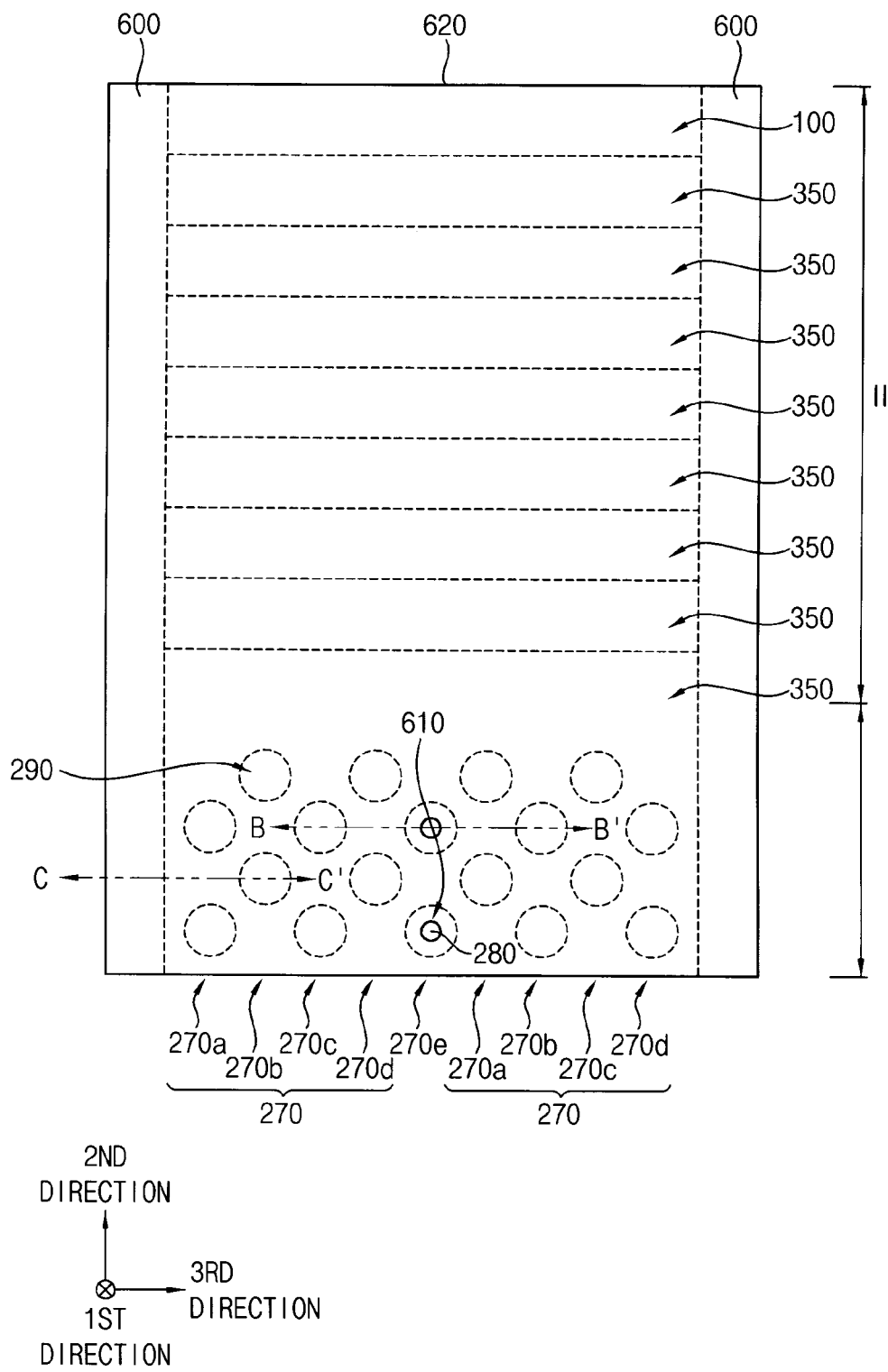
FIGS. 30 to 41 are plan views and cross-sectional views illustrating a method of manufacturing a vertical memory device in accordance with exemplary embodiments of the present disclosure.
Figure 31:
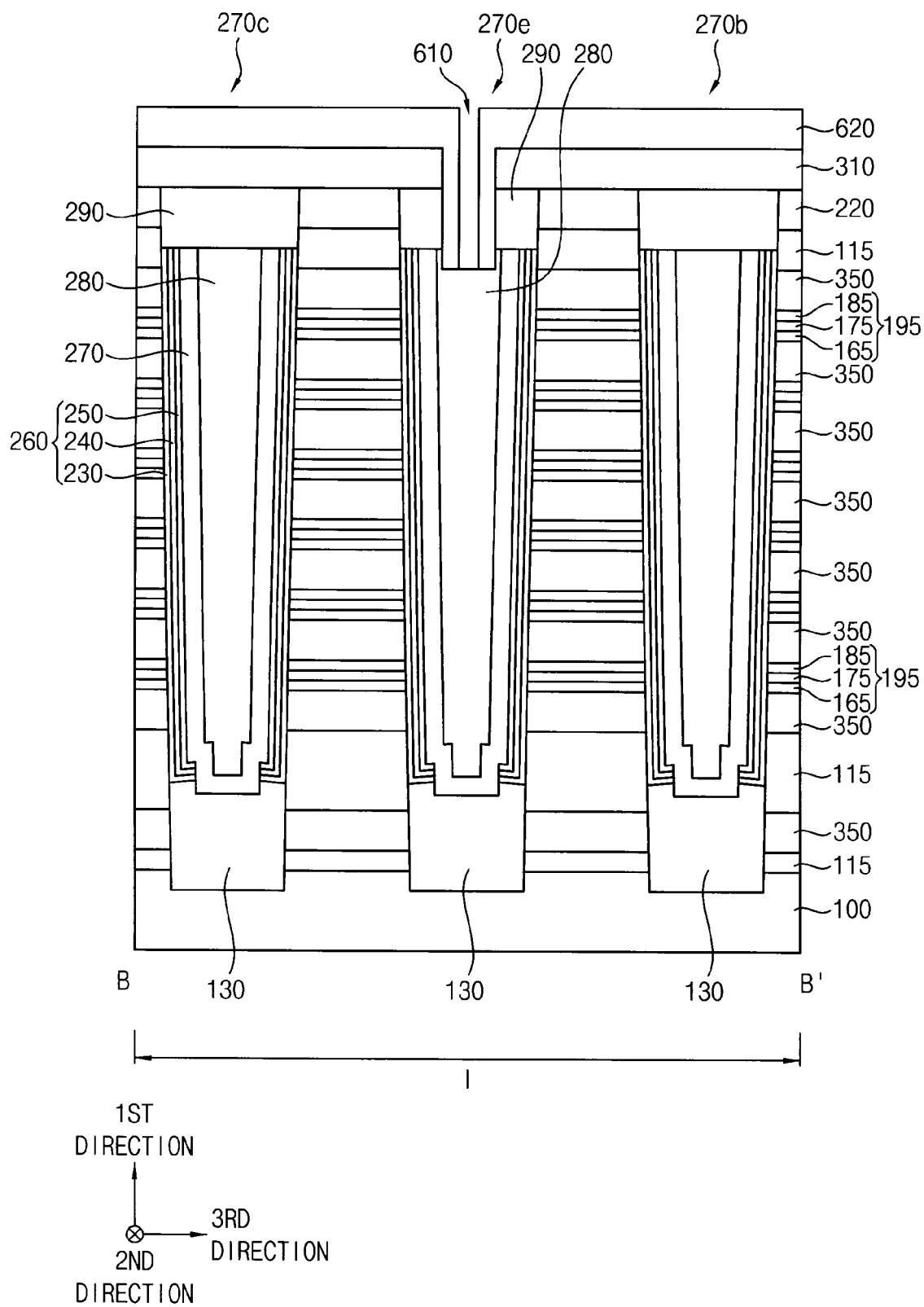
Figure 32:
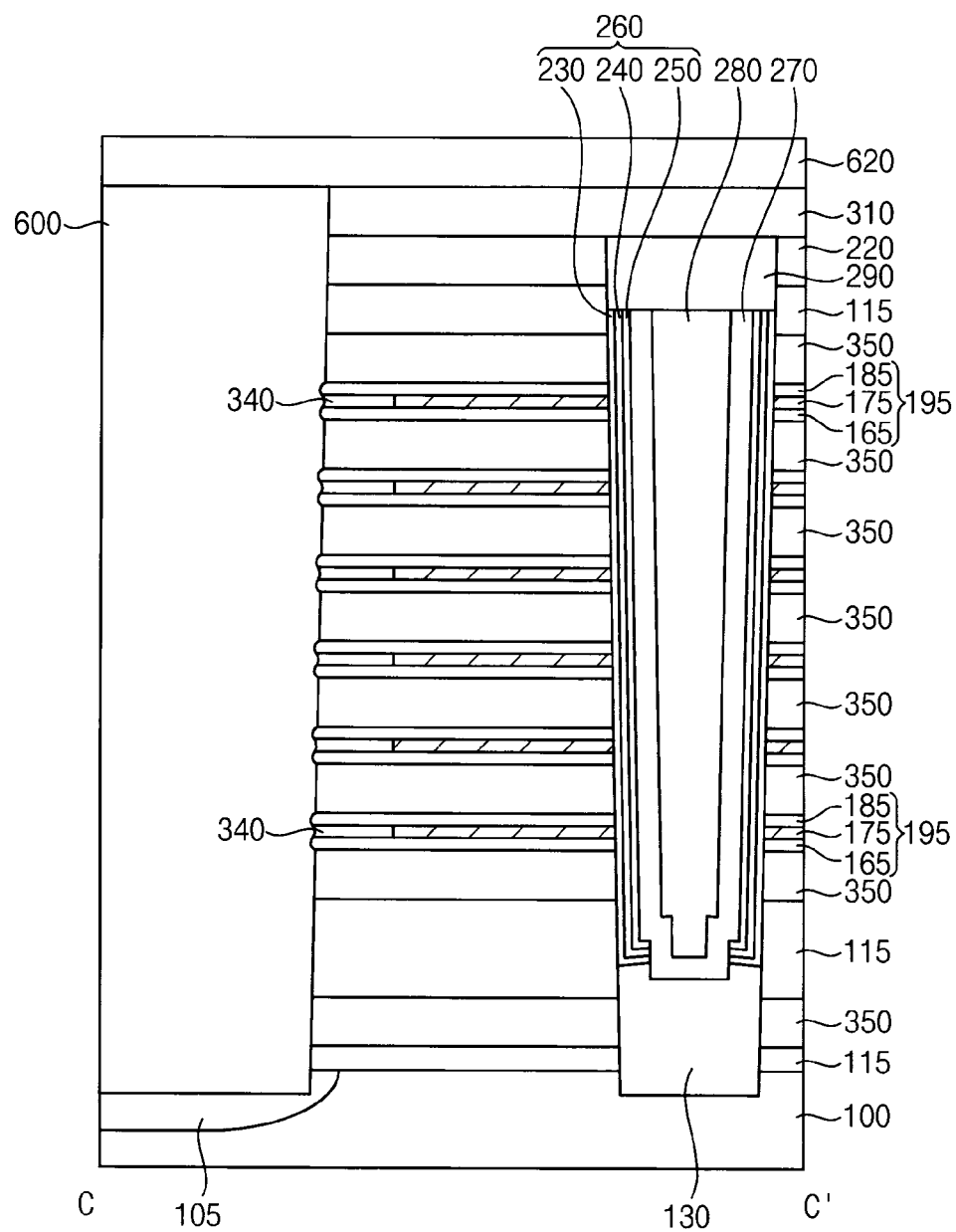
Figure 33:
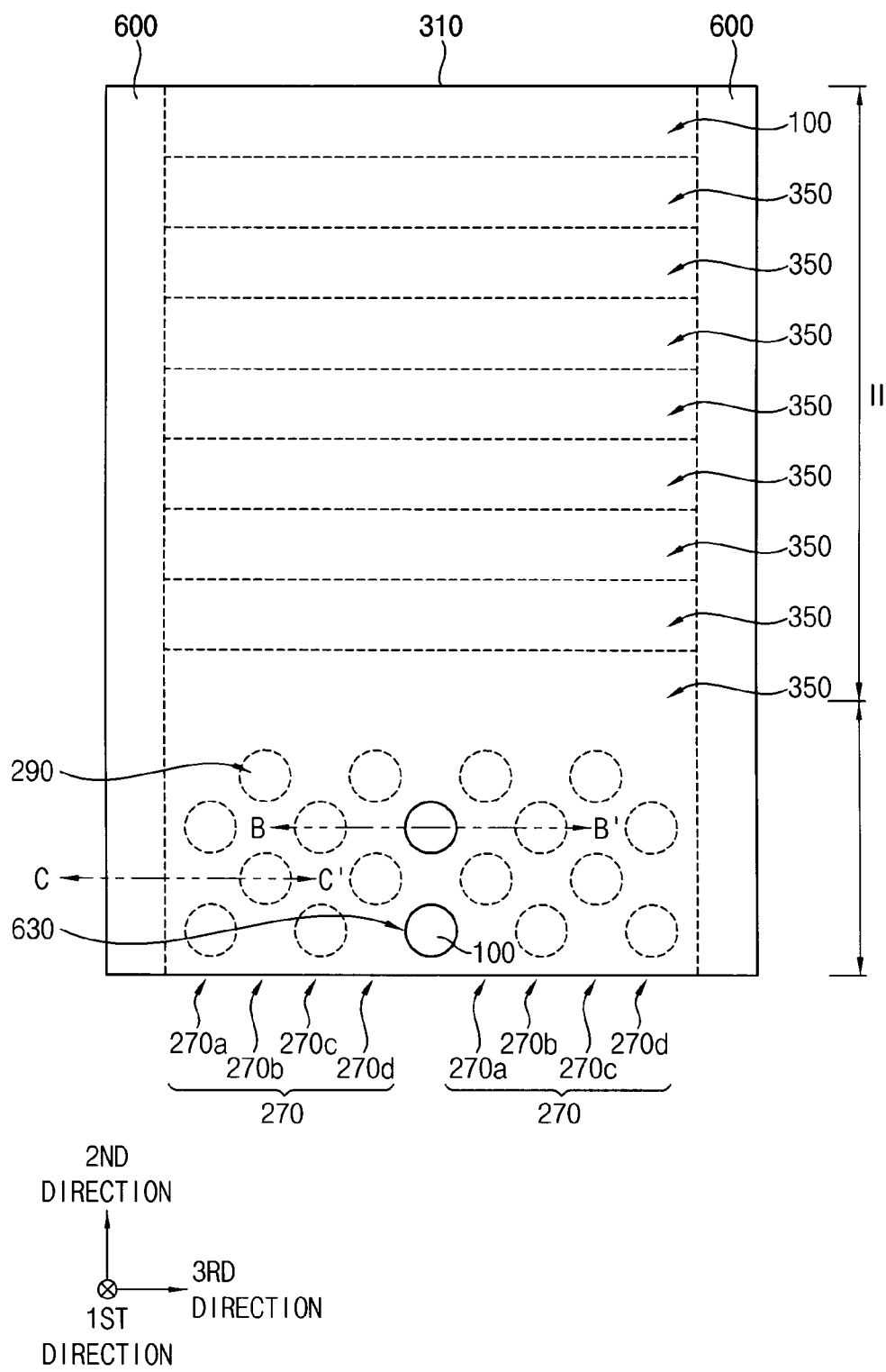
Figure 34:
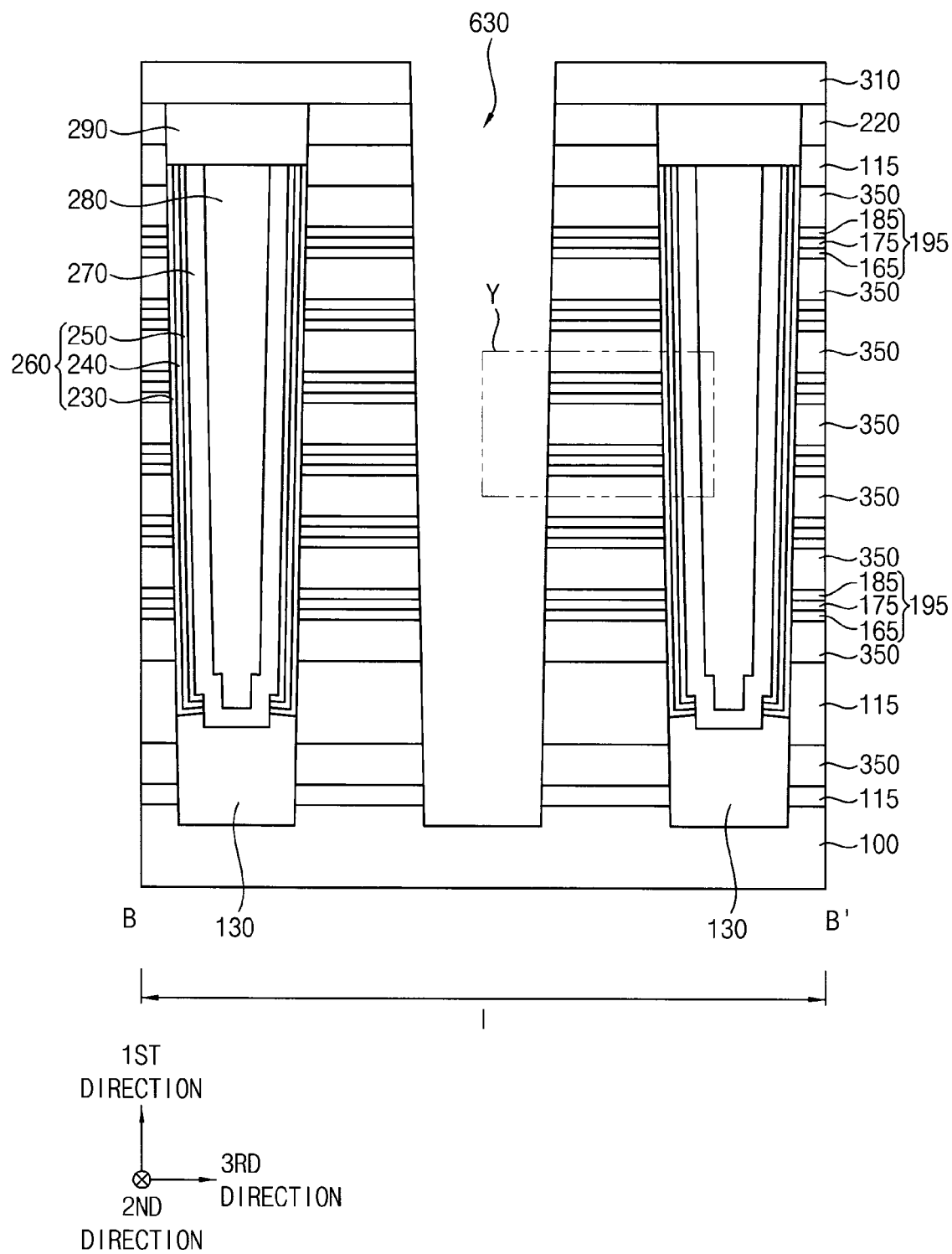
Figure 35:
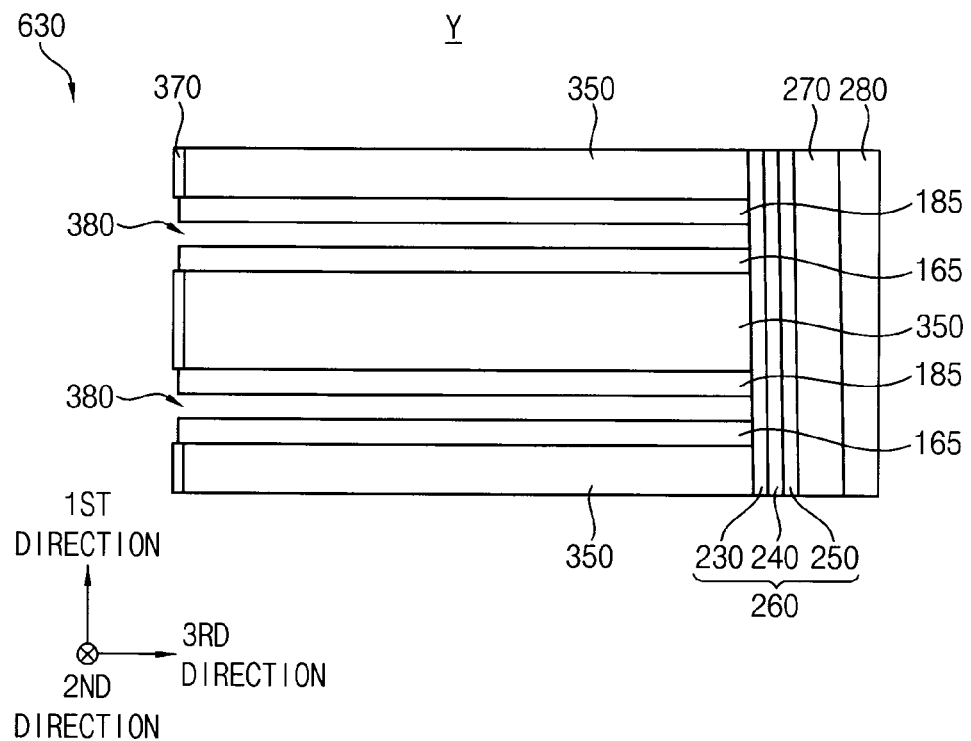
Figure 36:
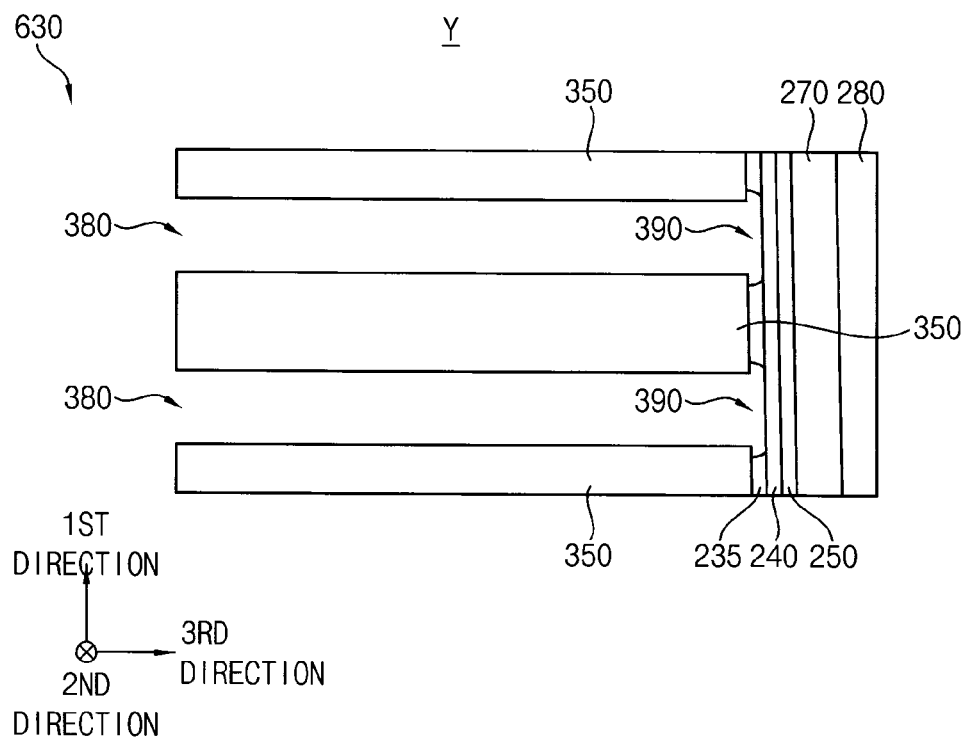
Figure 37:
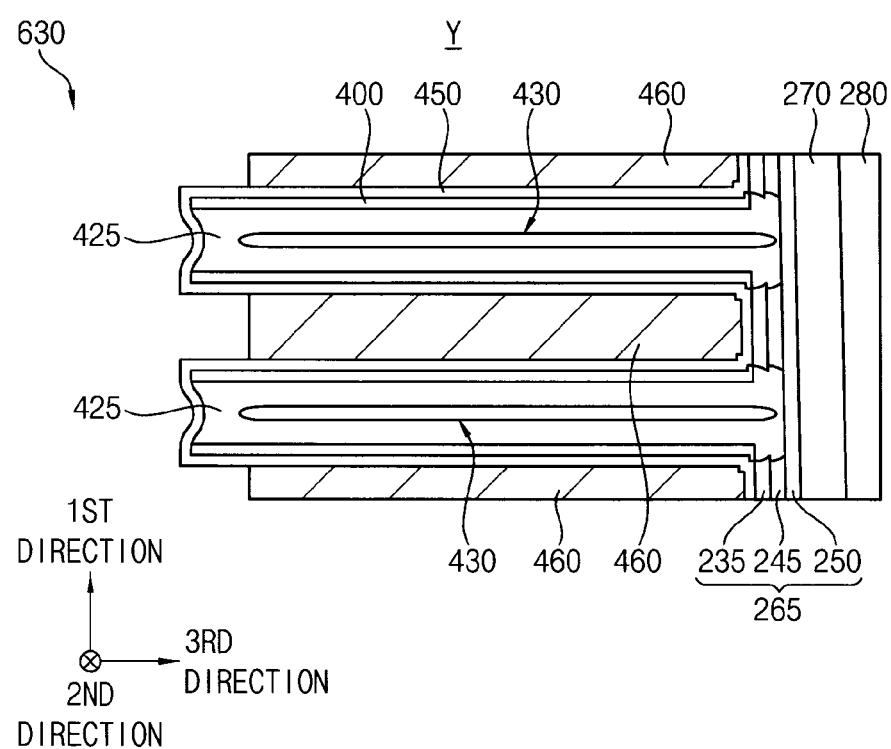

FIGS. 30 to 41 are plan views and cross-sectional views illustrating a method of manufacturing a vertical memory device in accordance with exemplary embodiments of the present disclosure. Particularly, FIGS. 30 and 33 are the plan views, and FIGS. 31-32 and 34-41 are the cross-sectional views. FIGS. 31, 34, 38 and 40 are cross-sectional views taken along lines B-B' of corresponding plan views, respectively, and FIGS. 32, 35-37, 39 and 41 are cross-sectional views taken along lines C-C' of corresponding plan views, respectively. FIGS. 35 to 37 are enlarged cross-sectional views of a region X of FIG. 34.

This method may include processes substantially the same as or similar to those illustrated with reference to FIG. 1 to 21, and repetitive explanations thereon are omitted herein. To the extent that certain elements are not described below, it may be assumed that these elements are at least similar to corresponding elements that have already been described herein.

Referring to FIGS. 30 to 32, processes substantially the same as or similar to those illustrated with reference to FIGS. 1 to 12 may be performed. However, the process illustrated with reference to FIGS. 6 and 7, for example, the process for forming the first division layer 300 may be skipped.

After forming a fourth insulation pattern 600 to fill the first opening 320, upper portions of the first and second insulating interlayers 220 and 310, the capping pattern 290 and the filling pattern 280 may be etched by an etching process using an etching mask, so that a seventh opening 610 may be formed to expose the filling pattern 280 and that a third etch stop layer 620 may be formed on a sidewall of the seventh opening 610 and the second insulating interlayer 310.

The fourth insulation pattern 600 may include an oxide, e.g., silicon oxide, and the third etch stop layer 620 may include a material having an etching selectivity with respect to the filling pattern 280, e.g., polysilicon.

Referring to FIGS. 33 and 34, the filling pattern 280 exposed by the seventh opening 610, the channel 270, the semiconductor pattern 130, and the charge storage structure 260 may be removed by, e.g., a wet etching process to form an eighth opening 630 exposing an upper surface of the substrate 100.

During the wet etching process, the third etch stop layer 620 and the capping pattern 290 may be entirely or partially removed, and if they partially remain, an additional process for removing them may be further performed.

Referring to FIG. 35, processes substantially the same as or similar to those illustrated with reference to FIG. 14 may be performed. However, the third sacrificial pattern 175 may be removed by the eighth opening 630 instead of the first opening 320, and thus the third opening 380 exposing a sidewall of the first blocking layer 230 may be formed.

The first etch stop layer 370 may also be formed on a sidewall of the sixth sacrificial pattern 350 adjacent the eighth opening 630.

Referring to FIG. 36, processes substantially the same as or similar to those illustrated with reference to FIG. 15 may be performed so that the second and fourth sacrificial patterns 165 and 185 may be removed to enlarge the third opening 380 in the first direction and that a portion of the first blocking layer 230 exposed by the enlarged third opening 380 may be removed to form the fourth opening 390. Thus, the first blocking layer 230 extending in the first direction may be divided into the first blocking patterns 235 spaced apart from each other in the first direction.

Figure 38:
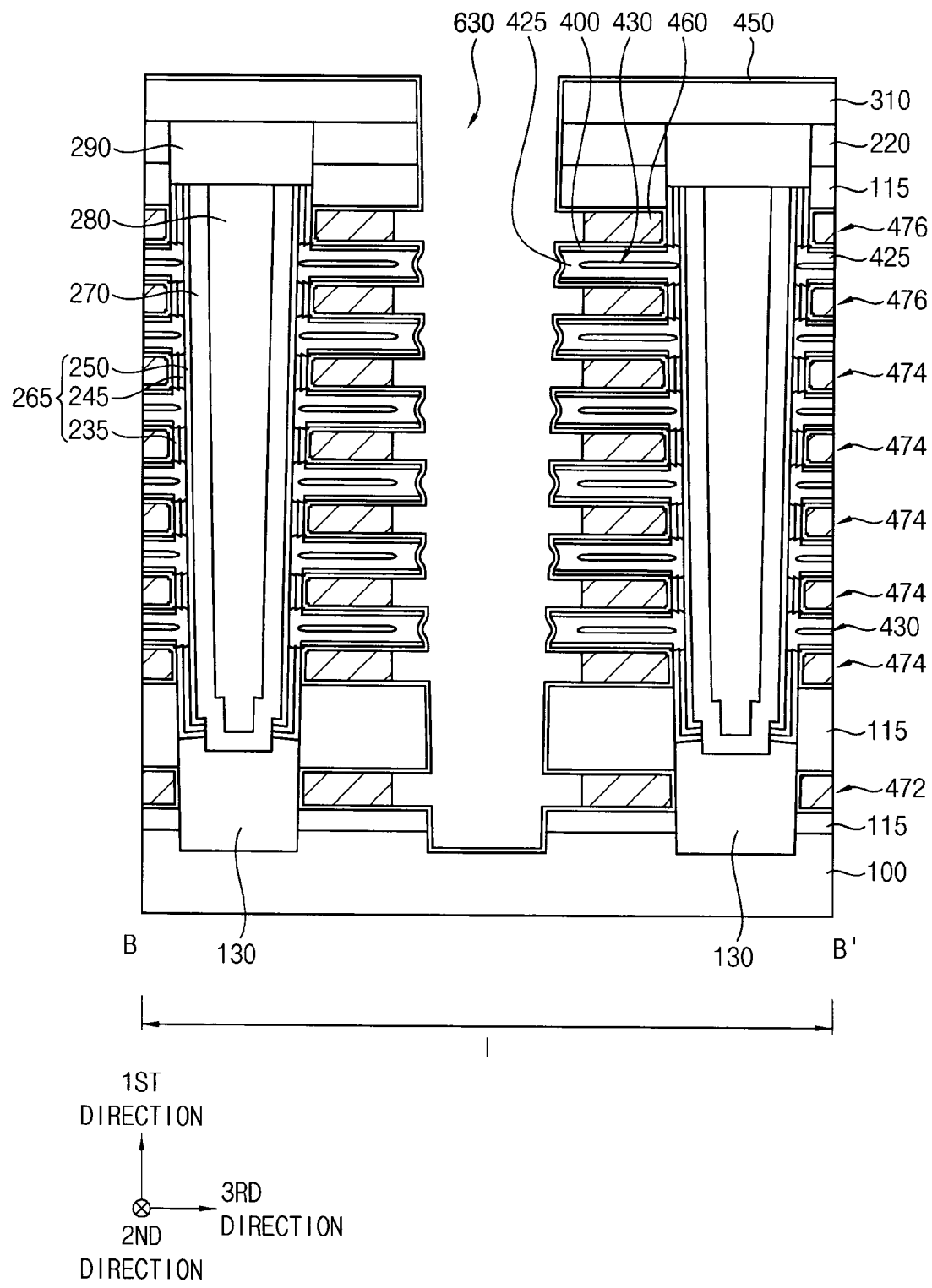
Figure 39:
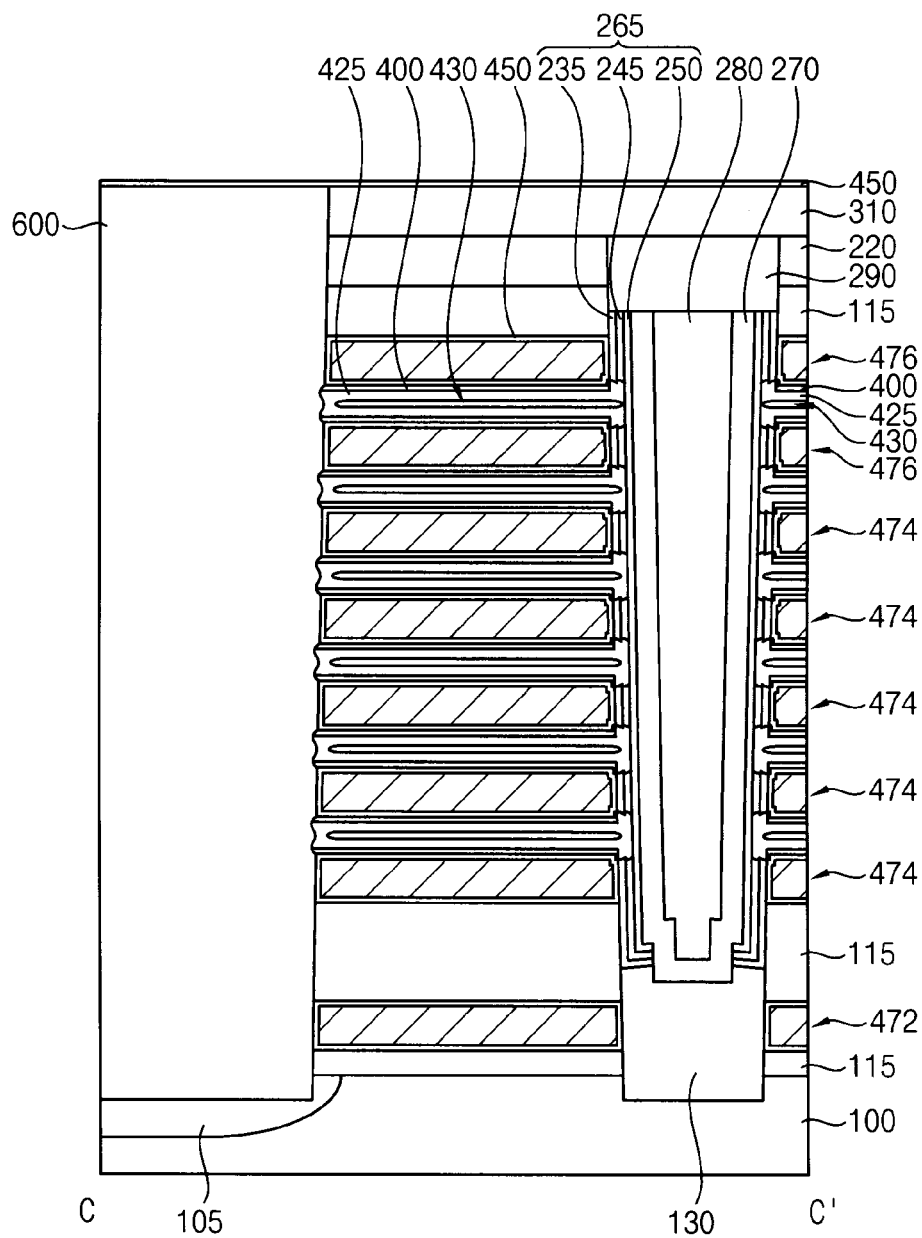

Referring to FIGS. 37 to 39, processes substantially the same as or similar to those illustrated with reference to FIGS. 16 to 19 may be performed.

Thus, the charge trapping layer 240 extending in the first direction may be divided into the charge trapping patterns 245 spaced apart from each other in the first direction, the sixth sacrificial patterns 350 may be replaced with the gate electrodes 460, and the second insulation pattern 425 including the air gap 430 therein may be formed between neighboring ones of the gate electrodes 460 in the first direction.

The second etch stop layer 400 may be formed the lower and upper surfaces of the second insulation pattern 425, and the second blocking layer 450 may be formed on a surface of the second etch stop layer 400, and sidewalls of the second etch stop layer 400 and the second insulation pattern 425 adjacent the eighth opening 630. The second blocking layer 450 may also be formed on sidewalls of the first and second insulating interlayers 220 and 310 and sidewalls of uppermost and lowermost ones of the first insulation patterns 115 adjacent the eighth opening 630 and the upper surface of the substrate 100 exposed by the eighth opening 630. Additionally, the second blocking layer 450 may at least partially cover the sidewall of the end portion in the third direction of each of the gate electrodes 460, and thus may contact a sidewall of the fourth insulation pattern 600.

Figure 40:
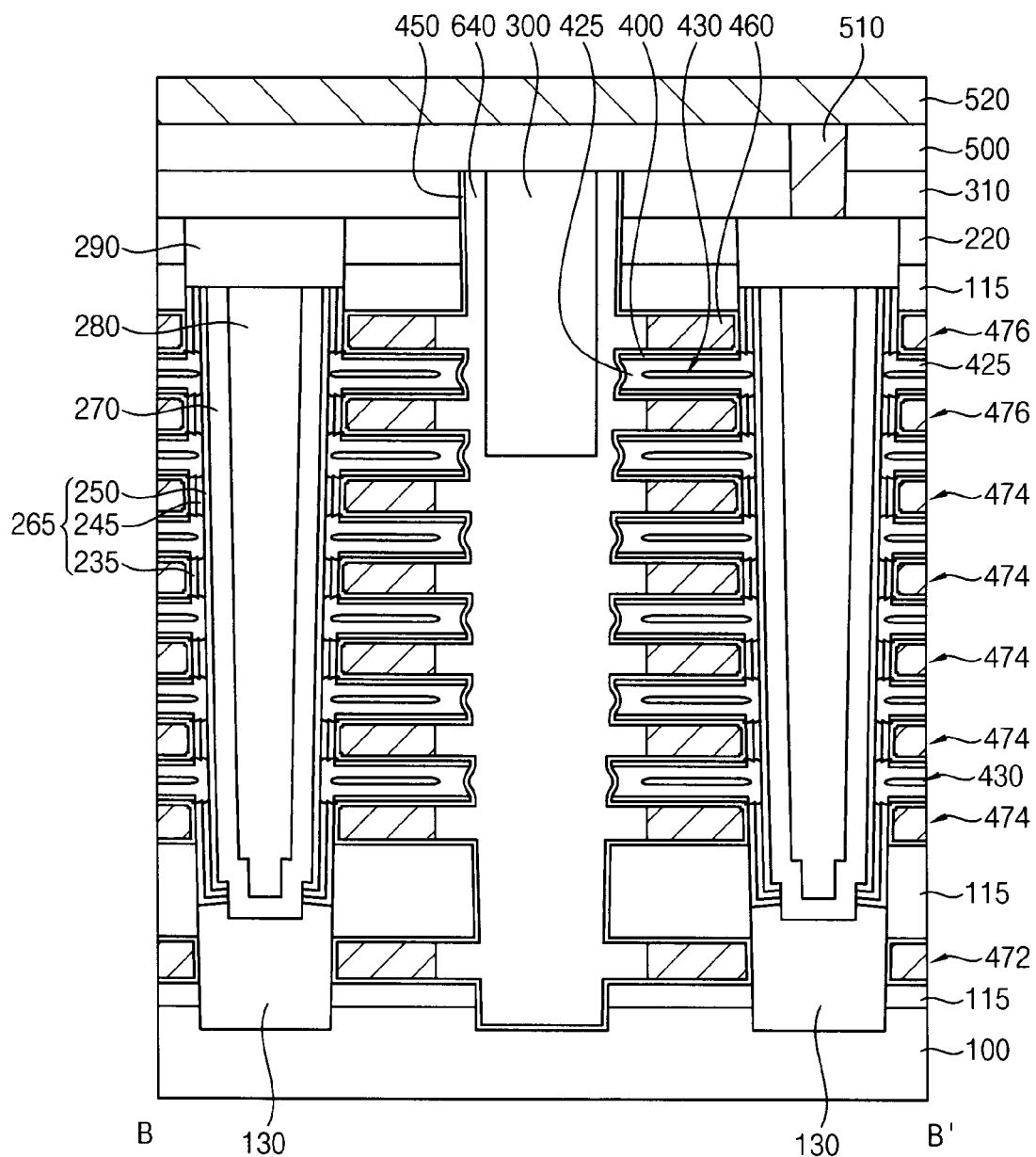
Figure 41:
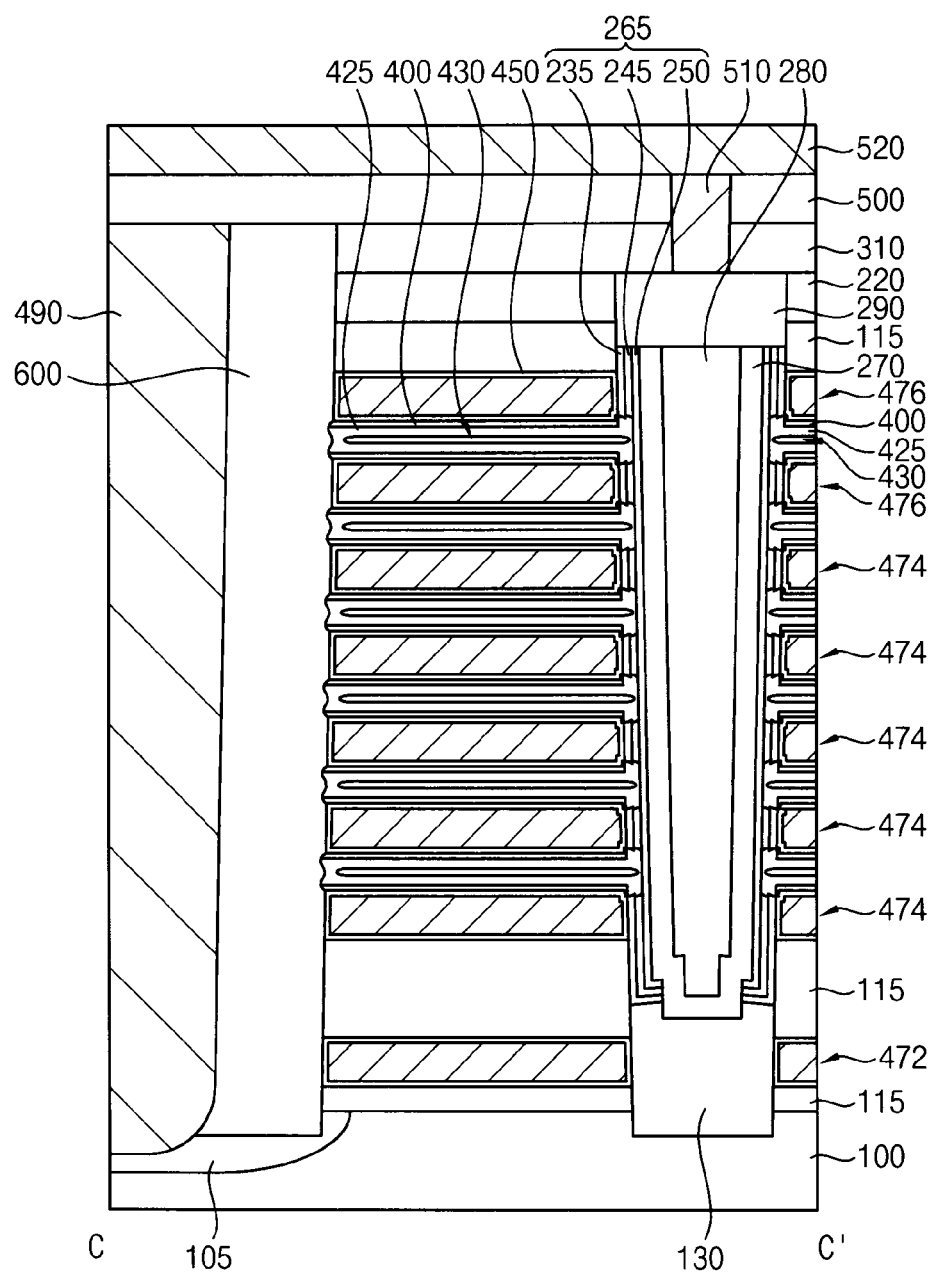

Referring to FIGS. 40 and 41, a fifth insulation layer may be formed on the second blocking layer 450 to fill the eighth opening 630, and may be planarized until the upper surface of the second insulating interlayer 310 may be exposed.

Thus, a fifth insulation pattern 640 may be formed in the eighth opening 630, which may form a second pillar structure. During the planarization process, a portion of the second blocking layer 450 on the upper surface of the second insulating interlayer 310 may also be removed. The fifth insulation pattern 640 may include an oxide, e.g., silicon oxide.

Processes substantially the same as or similar to those illustrated with reference to FIGS. 6 and 7 may be performed so that the first division layer 300 may be formed to at least partially extend through the first, second and fifth insulation patterns 115, 425 and 640, the first and second insulating interlayers 220 and 310, the third gate electrodes 476, the second blocking layer 450 and the second etch stop layer 400. Thus, each of the third gate electrodes 476 may be divided in the third direction by the first division layer 300.

Processes substantially the same as or similar to those illustrated with reference to FIGS. 20 and 21 may be performed to complete the fabrication of the vertical memory device.

As illustrated above, unlike those illustrated with reference to FIGS. 1 to 21, in the method of manufacturing the vertical memory device, the charge trapping layer 240 may be divided or the second insulation pattern 425 including the air gap 430 may be formed through the eighth opening 630, which may be formed by removing the first pillar structure including the channels 270 serving as the dummy channels included in the fifth channel column 270e, instead of the first opening 320 extending in the second direction. The process for replacing the first sacrificial pattern 125 with the sixth sacrificial pattern 350 may be performed through the first opening 320, however, the process for replacing the sixth sacrificial pattern 350 with the gate electrode 460 may be performed through the eighth opening 630.

The vertical memory device may have the following structural features unlike that of FIGS. 8, 19 and 21.

Particularly, the second pillar structure including an insulating material, for example, the fifth insulation pattern 640 may be formed unlike the first pillar structure including the channel 270, and the first and second pillar structures may be arranged in each of the second and third directions on the substrate 100. In exemplary embodiments of the present disclosure, the second pillar structures may be formed by replacing the first pillar structure having the channel 270 included in the fifth channel column 270e with the fifth insulation pattern 640. Thus, the second pillar structures may be arranged in the second direction to be spaced apart from each other.

In exemplary embodiments of the present disclosure, a portion of a sidewall of the second pillar structure facing each of the gate electrodes 460 may protrude in the horizontal direction when compared to a portion of the sidewall of the second pillar structure facing each of the second insulation patterns 425. Thus, the second pillar structure may have an uneven sidewall.

In exemplary embodiments of the present disclosure, the second blocking layer 450 may at least partially cover the lower and upper surfaces of each of the gate electrodes 460, the sidewall facing the first pillar structure of each of the gate electrodes 460, and the sidewall of the end portion in the third direction of each of the gate electrodes 460. Additionally, the second blocking layer 450 may at least partially cover the sidewall of the second insulation pattern 425 facing the second pillar structure, and thus may extend in the first direction between the second pillar structure and the first pillar structure.

Figure 42:
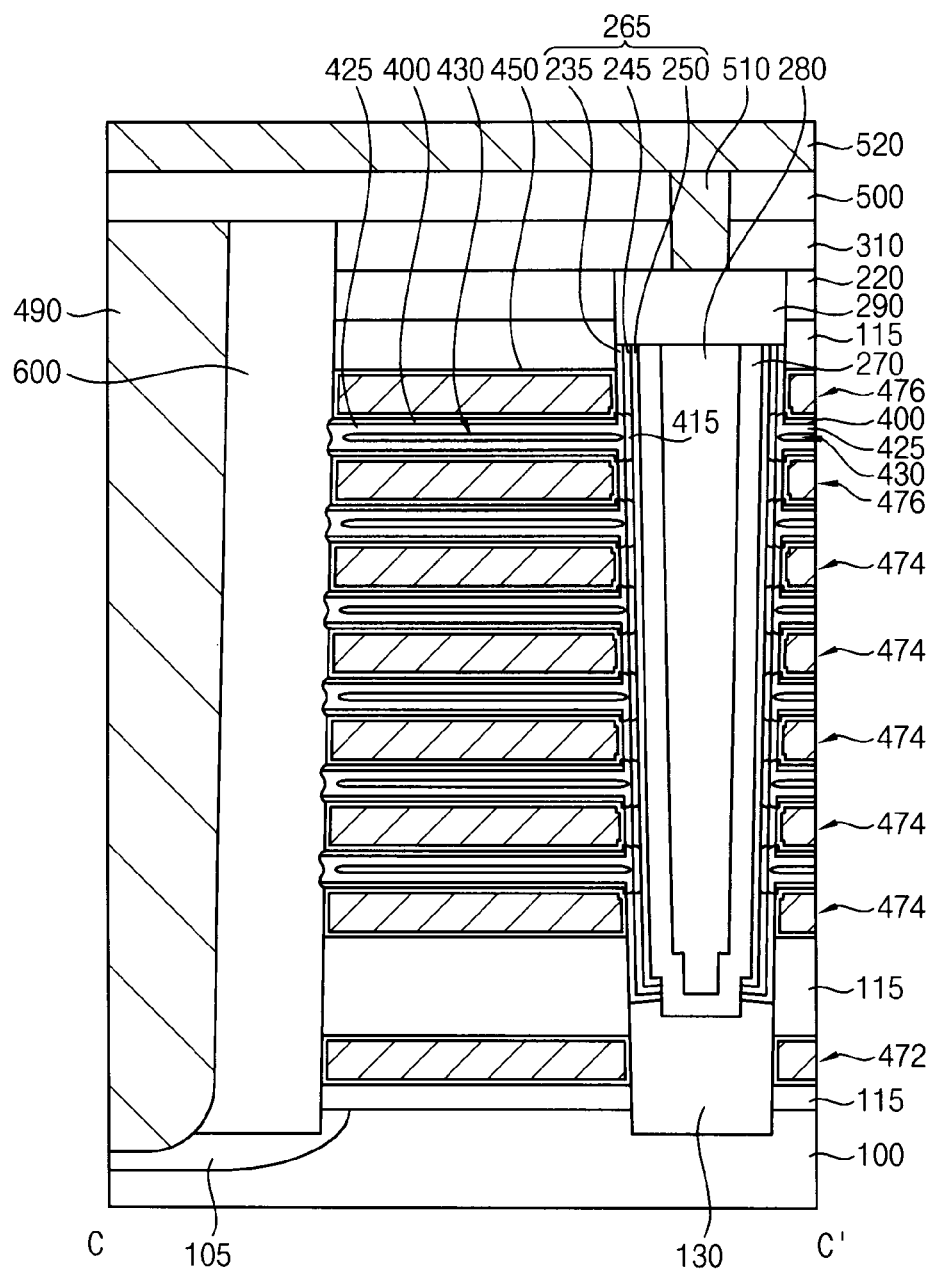
FIG. 42 is a cross-sectional view illustrating a vertical memory device in accordance with exemplary embodiments of the present disclosure, in which a cross-sectional view is taken along the line C-C' of a corresponding plan view.

FIG. 42 is a cross-sectional view illustrating a vertical memory device in accordance with exemplary embodiments of the present disclosure, particularly, a cross-sectional view taken along the line C-C' of a corresponding plan view.

This vertical memory device may be substantially the same as or similar to that of FIG. 21, except for some elements. Thus, like reference numerals may refer to like elements, and detailed descriptions thereon are omitted herein. To the extent that certain elements are not described below, it may be assumed that these elements are at least similar to corresponding elements that have already been described herein.

Referring to FIG. 42, processes substantially the same as or similar to FIGS. 28 and 29 may be performed. Thus, the portion of the charge trapping layer 240 exposed by the fourth opening 390 may be oxidized, instead of forming the fifth opening 410, so that the charge trapping layer 240 may be divided into the charge trapping patterns 245 spaced apart from each other in the first direction.

While exemplary embodiments of the present disclosure have been particularly shown and described, it will be understood by one of ordinary skill in the art that variations in form and detail may be made therein without departing from the spirit and scope of the claims.

What is claimed is:

1. A vertical memory device, comprising
a channel disposed on a substrate, the channel extending primarily in a first direction that is perpendicular to an upper surface of the substrate;
a charge storage structure disposed on an outer sidewall of the channel, the charge storage structure including a tunnel insulation layer and a first blocking pattern sequentially stacked in a horizontal direction that is parallel to the upper surface of the substrate;
a plurality of gate electrodes spaced apart from each other in the first direction, each of the plurality of gate electrodes at least partially surrounding the charge storage structure; and
a first insulation pattern disposed between neighboring gate electrodes of the plurality of gate electrodes,
wherein the charge storage structure further includes charge trapping patterns spaced apart from each other in the first direction, each of the charge trapping patterns facing one of the gate electrodes, of the plurality of gate electrodes, in the horizontal direction, and
wherein a length in the first direction from a bottom-most surface of each charge trapping pattern to a top-most surface of each charge trapping pattern on a side of each charge trapping pattern that faces the first blocking pattern is less than a length in the first direction from a bottom-most surface of each charge trapping pattern to a top-most surface of each charge trapping pattern on a side of each charge trapping pattern that faces the tunnel insulation layer.

2. The vertical memory device of claim 1, wherein the first insulation pattern is further disposed between the charge trapping patterns.

3. The vertical memory device of claim 1, further comprising a division layer disposed between the charge trapping patterns.

4. The vertical memory device of claim 1, wherein a length in the first direction of each of the charge trapping patterns gradually increase from the outer sidewall thereof toward the inner sidewall thereof.

5. The vertical memory device of claim 4, wherein an absolute value of a slope of an upper surface or a lower surface of each of the charge trapping patterns, with respect to the upper surface of the substrate, gradually increases from the outer sidewall thereof toward the inner sidewall thereof.

6. The vertical memory device of claim 1, wherein the charge storage structure includes first blocking patterns spaced apart from each other in the first direction, each of the first blocking patterns facing one of the plurality of gate electrodes in the horizontal direction, and the first insulation pattern is disposed between the first blocking patterns, and
wherein a length in the first direction of an outer sidewall of each of the first blocking patterns facing the one of the gate electrodes is less than a length in the first direction of an inner sidewall of each of the first blocking patterns facing one of the charge trapping patterns.

7. The vertical memory device of claim 1, further comprising an etch stop layer disposed on lower and upper surfaces of the first insulation pattern.

8. The vertical memory device of claim 7, wherein the etch stop layer is omitted from lower and upper surfaces of a portion of the first insulation pattern between the charge trapping patterns.

9. The vertical memory device of claim 1, further comprising a second blocking layer at least partially covering lower and upper surfaces of each of the plurality of gate electrodes and at least partially covering a sidewall facing the charge storage structure of each of the plurality of gate electrodes, the second blocking layer including a metal oxide.

10. The vertical memory device of claim 9, wherein the second blocking layer extends primarily in the first direction and at least partially covers the lower and upper surfaces and the sidewall facing the charge storage structure of each of the plurality of gate electrodes and a sidewall of the first insulation pattern adjacent each of the plurality of gate electrodes.

11. The Vertical memory device of claim 1, wherein each of the plurality of gate electrodes extends in a second direction that is parallel to the upper surface of the substrate, and
wherein a thickness in the first direction of the first insulation pattern at an end portion thereof in a third direction is greater than a thickness in the first direction of the first insulation pattern at other portions thereof, the third direction being parallel to the upper surface of the substrate and crossing the second direction.

12. The vertical memory device of claim 1, wherein the first insulation pattern includes an oxide and has an air gap disposed therein.

13. A vertical memory, device comprising:
a channel disposed on a substrate, the channel extending primarily in a first direction that is perpendicular to an upper surface of the substrate;
a charge storage structure disposed on an outer sidewall of the channel, the charge storage structure including a tunnel insulation layer and a first blocking pattern sequentially stacked in a horizontal direction that is parallel to the upper surface of the substrate;
a plurality of gate electrodes spaced apart from each other in the first direction, each of the plurality of gate electrodes at least partially surrounding the charge storage structure;
an insulation pattern disposed between neighboring gate electrodes of the plurality of gate electrodes, the insulation pattern including an oxide and having an air gap disposed therein; and
an etch stop layer disposed on lower and upper surfaces of the insulation pattern,
wherein the charge storage structure thither includes charge trapping patterns spaced apart from each other in the first direction, each of the charge trapping patterns facing one of the plurality of gate electrodes in the horizontal direction, and each of the charge trapping, patterns having, a substantially isosceles trapezoid shape.

14. The vertical memory device of claim 13, wherein the etch stop layer is omitted from lower and upper surfaces of a portion of the insulation pattern disposed between the charge trapping patterns.

15. The vertical memory device of claim 13, wherein the etch stop layer includes silicon oxide, and is a separate layer than the insulation pattern.

16. The vertical memory device of claim 13, wherein the insulation pattern is also formed between the charge trapping patterns.

17. The vertical memory device of claim 13, further comprising a division layer disposed between the charge trapping patterns.

18. The vertical memory device of claim 13, wherein the air gap has a substantially ovaloid shape.

19. A vertical memory device, comprising:
a channel disposed on a substrate, the channel extending primarily in a first direction that is perpendicular to an upper surface of the substrate;
a charge storage structure disposed on an outer sidewall of the channel, the charge storage structure including a tunnel insulation layer and a first blocking pattern sequentially stacked in a horizontal direction that is parallel to the upper surface of the substrate;
a plurality of gate electrodes spaced apart from each other in the first direction, each of the plurality of gate electrodes extending primarily in a second direction that is parallel to the upper surface of the substrate so as to at least partially surround the charge storage structure;
an insulation pattern disposed between neighboring gate electrodes of the plurality of gate electrodes, the insulation pattern including an oxide and having an air gap disposed therein;
a protection layer covering a sidewall of an end portion in a third direction of each of the plurality of gate electrodes, the third direction being parallel to the upper surface of the substrate and crossing the second direction, the protection layer not contacting either a lower surface or an upper surface of each of the plurality of gate electrodes; and
a second blocking pattern at least partially covering both lower and upper surfaces of each of the plurality of gate electrodes and at least partially covering a sidewall facing the charge storage structure of each of the plurality of gate electrodes and lower and upper surfaces of the protection layer,
wherein the charge storage structure further includes charge trapping patterns spaced apart from each other in the first direction, each of the charge trapping, patterns facing one of the plurality of gate electrodes in the horizontal direction, and
wherein the protection layer includes silicon oxide, and the second blocking pattern includes a metal oxide.

20. The vertical memory device of claim 19, wherein the second blocking pattern includes aluminum oxide or hafnium oxide.

21. The vertical memory device of claim 19, wherein end portions in the third direction of the insulation pattern, the protection layer and the second blocking pattern aligned with each other in the first direction.

* * * * *